United States Patent
Nakaya et al.

(10) Patent No.: US 6,203,933 B1
(45) Date of Patent: *Mar. 20, 2001

(54) ORGANIC EL ELEMENT

(75) Inventors: Kenji Nakaya; Tetsushi Inoue, both of Chiba (JP)

(73) Assignee: TDK Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/648,766

(22) Filed: May 16, 1996

(30) Foreign Application Priority Data

May 17, 1995 (JP) .................................... 7-142507

(51) Int. Cl.$^7$ .................................... H05B 33/14
(52) U.S. Cl. .................... 428/690; 428/917; 313/502; 313/504; 313/506
(58) Field of Search ................................. 428/690, 917, 428/457; 313/502, 504, 506

(56) References Cited

U.S. PATENT DOCUMENTS

| | | | |
|---|---|---|---|
| 4,720,432 | * 1/1988 | Van Slyke et al. | 428/457 |
| 4,769,292 | 9/1988 | Tang et al. . | |
| 5,077,142 | * 12/1991 | Sakon et al. | 428/690 |
| 5,151,629 | 9/1992 | Vanslyke . | |
| 5,294,869 | 3/1994 | Tang et al. . | |
| 5,393,614 | * 2/1995 | Nakada | 428/690 |
| 5,540,999 | * 7/1996 | Yamamoto et al. | 428/411.1 |
| 5,635,308 | * 6/1997 | Inoue et al. | 428/690 |

FOREIGN PATENT DOCUMENTS

| | | |
|---|---|---|
| 63-264692 | 11/1988 | (JP) . |
| 5-32966 | 2/1993 | (JP) . |
| 5-178810 | * 7/1993 | (JP) . |
| 5-198377 | 8/1993 | (JP) . |
| 5-214334 | 8/1993 | (JP) . |
| 5-258859 | 10/1993 | (JP) . |
| 6-220437 | * 8/1994 | (JP) . |
| 6-228555 | * 8/1994 | (JP) . |
| 6-271846 | * 9/1994 | (JP) . |

* cited by examiner

Primary Examiner—Marie Yamnitzky
(74) Attorney, Agent, or Firm—Oblon, Spivak, McClelland, Maier & Neustadt, P.C.

(57) ABSTRACT

An organic EL element of the invention has an organic compound layer, especially a light emitting layer which contains a compound of the following general formula (I): $(Ar)_m$-L wherein Ar is an aromatic-bearing group, m is an integer of 2 to 6, the Ar groups may be the same or different, and L is a m-valent residue of a condensed polycyclic aromatic compound having 3 to 10 rings. Where L is a di- or trivalent residue derived from anthracene, at least one Ar is an aromatic residue derived from an alkynylarene. Where L is a tetravalent residue derived from naphthacene and Ar groups are attached at the 5-, 6-, 11- and 12-positions thereof, all the four Ar groups are not phenyl groups at the same time. The device of the invention sustains light emission of satisfactory luminance, especially at long wavelength for a long time.

8 Claims, 5 Drawing Sheets

ORGANIC EL ELEMENT

BACKGROUND OF THE INVENTION

1. Field of the Invention

This invention relates to an organic electroluminescent (EL) element.

2. Background Art

Doping is one technique for producing light emission of any desired color from EL elements. It was reported in Jpn. J. Appl. Phys., 10, 527 (1971) to change emission color from blue to green by doping anthracene crystals with a minor amount of tetracene. With respect to organic thin film EL elements having a multilayer structure, it was reported in JP-A 264692/1988 to incorporate in a host material having a light emitting function a minor amount of a fluorescent dye capable of emitting light different from that of the host material in response to light emission from the host material as a dopant to form a light emitting layer, thereby changing the color of light emission from green to orange or red.

With respect to long wavelength light emission of yellow to red, known light emitting materials or dopant materials include laser dyes capable of red oscillation (EP 0281381), compounds capable of exciplex emission (JP-A 255788/1990), perylene compounds (JP-A 791/1991), coumarin compounds (JP-A 792/1991), dicyanomethylene compounds (JP-A 162481/1991), thioxanthene compounds (JP-A 177486/1991), mixtures of a conjugated polymer and an electron transporting compound (JP-A 73374/1994), squalirium compounds (JP-A 93257/1994), oxadiazole compounds (JP-A 136359/1994), oxynate derivatives (JP-A 145146/1994), and pyrene compounds (JP-A 240246/1994).

Other light emitting materials disclosed heretofore include condensed polycyclic aromatic compounds (JP-A 32966/1993 and 214334/1993). Also dopant materials proposed heretofore include various condensed polycyclic aromatic compounds (JP-A 258859/1993).

These light emitting systems, however, do not provide high luminance or stable light emitting performance. A further improvement in luminance or durability is thus desired.

DISCLOSURE OF THE INVENTION

A primary object of the invention is to provide an organic EL element which produces light emission of satisfactory luminance, especially at long wavelength and is durable in that improved light emitting performance lasts for a long time.

This and other objects of the invention are attained by the construction defined below as (1) to (13).

(1) An organic EL element comprising at least one organic compound layer containing a compound of the following general formula (I):

$(Ar)_m$-L     (I)

wherein Ar is an aromatic-bearing group, m is an integer of 2 to 6, the Ar groups may be the same or different, and L is a m-valent residue of a condensed polycyclic aromatic compound having 3 to 10 rings, with the proviso that where L is a di- or trivalent residue derived from anthracene, at least one Ar is an aromatic residue derived from an alkynylarene, and that where L is a tetravalent residue derived from naphthacene and Ar groups are attached at the 5-, 6-, 11- and 12-positions thereof, all the four Ar groups are not phenyl groups at the same time.

(2) The organic EL element of (1) wherein Ar is an aromatic hydrocarbon residue, and L is a di-, tri- or tetravalent residue derived from a condensed polycyclic aromatic hydrocarbon.

(3) The organic EL element of (2) wherein said condensed polycyclic aromatic hydrocarbon is naphthacene, pentacene or hexacene.

(4) The organic EL element of (1) wherein L is a trivalent residue derived from anthracene, two Ar groups are arylalkynyl groups, and one Ar group is a bis(arylalkynyl)anthryl group.

(5) The organic EL element of (1) wherein said organic compound layer containing said compound of the general formula (I) is a light emitting layer.

(6) The organic EL element of (5) wherein said light emitting layer contains a quinoline derivative.

(7) The organic EL element of (6) wherein said quinoline derivative is tris(8-quinolinolato)aluminum.

(8) The organic EL element of (5) wherein said light emitting layer is a mix layer of at least one hole injecting and transporting compound and at least one electron injecting and transporting compound.

(9) The organic EL element of (5) wherein said compound of the general formula (I) is contained in said light emitting layer in a concentration of 0.01 to 20% by weight.

(10) The organic EL element of (5) further comprising at least one hole injecting and transporting layer.

(11) The organic EL element of (10) wherein said hole injecting and transporting layer includes at least one hole injecting layer and at least one hole transporting layer, said light emitting layer adjoining the hole transporting layer.

(12) The organic EL element of (5) further comprising at least one electron injecting and transporting layer.

(13) The organic EL element of (12) wherein said electron injecting and transporting layer includes at least one electron injecting layer and at least one electron transporting layer, said light emitting layer adjoining the electron transporting layer.

FUNCTION AND EFFECT

According to the invention, a compound of the general formula (I) is contained in an organic compound layer, especially a light emitting layer. This results in an organic EL element capable of light emission in the wave-length range of about 460 to 700 nm, especially having the maximum wavelength of light emission in the long wavelength range. Particularly when the compound of the general formula (I) is used in a light emitting layer as a dopant for a host material having a light emitting function in itself or as a dopant in a mix layer with a light emitting function formed from a mixture of an electron injecting and transporting compound and a hole injecting and transporting compound, light emission of blue to red, especially long wavelength light emission is possible at sufficient luminance and the light emitting performance lasts long.

Although a variety of condensed polycyclic aromatic compounds are disclosed in JP-A 264692/1988, 32966/1993, 198377/1993, 214334/1993, and 258859/1993, their structure is apparently different from the compounds of the general formula (I) according to the invention.

ILLUSTRATIVE CONSTRUCTION

Figure 1:
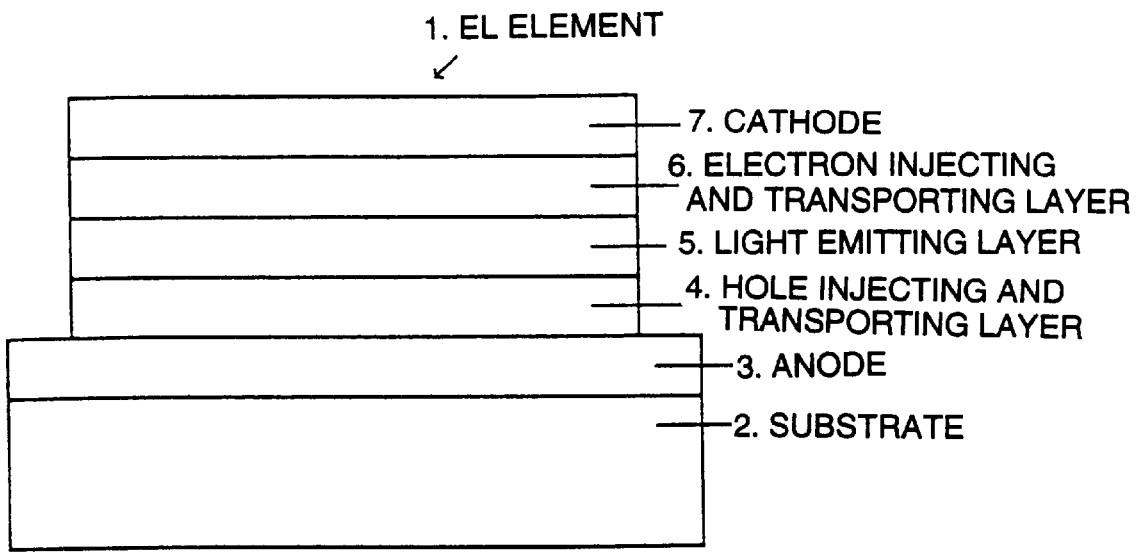
FIG. 1 is a side view of an organic EL element according to one embodiment of the invention.

Now the construction of the invention is described in detail.

The organic EL element of the invention has at least one organic compound layer containing an organic compound. At least one organic compound layer contains a compound of the following general formula (I).

$(Ar)_m$-L           (I)

In the general formula (I), Ar is an aromatic-bearing group, m is an integer of 2 to 6, and the Ar groups may be the same or different.

The aromatic-bearing groups include residues of aromatic hydrocarbons and residues of aromatic heterocyclics. The aromatic hydrocarbon residue may be any of hydrocarbon groups possessing a benzene ring, for example, residues of monocyclic or polycyclic aromatic hydrocarbons inclusive of fused rings and ring gathering.

The aromatic hydrocarbon residues preferably have 6 to 30 carbon atoms in total and may have a substituent. The substituents, if any, include alkyl groups, alkoxy groups, aryl groups, aryloxy groups, amino groups, and heterocyclic groups. Examples of the aromatic hydrocarbon residue include phenyl, alkylphenyl, alkoxyphenyl, arylphenyl, aryloxyphenyl, alkenylphenyl, aminophenyl, naphthyl, anthryl, pyrenyl, and perylenyl groups. Also included are arylalkynyl groups derived from alkynylarenes or arylalkynes.

Preferred residues of aromatic heterocyclics are those containing O, N or S as a hetero-atom and may be either five or six-membered. Examples are thienyl, furyl, pyrrolyl, and pyridyl groups.

Ar is preferably selected from residues of aromatic hydrocarbons, especially aryl groups such as phenyl, alkylphenyl, arylphenyl, alkenylphenyl, aminophenyl, and naphthyl groups and arylalkynyl groups.

Preferred among the alkylphenyl groups are such groups whose alkyl moiety has 1 to 10 carbon atoms. The alkyl groups may be either normal or branched and include methyl, ethyl, n-propyl, i-propyl, n-butyl, i-butyl, sec-butyl, tert-butyl, n-pentyl, i-pentyl, neo-pentyl, tert-pentyl, n-hexyl, i-hexyl, and neo-hexyl groups. These alkyl groups may be attached to the phenyl group at any of o, m and p-positions. Examples of the alkylphenyl group include o-tolyl, m-tolyl, p-tolyl, 4-n-butylphenyl, and 4-t-butylphenyl.

Preferred among the arylphenyl groups are such groups whose aryl moiety is a phenyl group. The phenyl group may be a substituted one wherein the substituent is preferably an alkyl group, examples of which are as exemplified above for the alkylphenyl group. The aryl moiety may also be a phenyl group substituted with an aryl group such as a phenyl group. Examples of the arylphenyl group include o-biphenylyl, m-biphenylyl, p-biphenylyl, 4-tolylphenyl, 3-tolylphenyl, and terephenylyl groups.

Preferred among the alkenylphenyl groups are such groups whose alkenyl moiety has 2 to 20 carbon atoms in total. The alkenyl groups are preferably triarylalkenyl groups, for example, triphenylvinyl, tritolylvinyl and tribi-phenylvinyl groups. Illustrative examples of the alkenylphenyl group include triphenylvinylphenyl and similar groups.

Preferred among the aminophenyl groups are such groups whose amino moiety is a diarylamino group. The diarylamino groups are preferably diphenylamino and phenyltolylamino groups. Illustrative examples of the aminophenyl group include diphenylaminophenyl and phenyltolylaminophenyl groups.

Included in the naphthyl groups are 1-naphthyl and 2-naphthyl groups.

The arylalkynyl groups are preferably those groups having 8 to 20 carbon atoms in total, examples of which include phenylethynyl, tolylethynyl, biphenylylethynyl, naphthylethynyl, diphenylaminophenylethynyl, N-phenyltolylaminophenylethynyl, and phenylpropynyl groups.

L in the general formula (I) stands for a m-valent (divalent to hexavalent) residue of a condensed polycyclic aromatic compound having 3 to 10 rings, preferably 3 to 6 rings. The term condensed ring refers to a cyclic structure formed by a carbocyclic or heterocyclic ring which is coupled with another ring such that the ring shares at least two of its ring-constituting atoms with the other ring. The condensed polycyclic aromatic compounds include condensed polycyclic aromatic hydrocarbons and condensed polycyclic aromatic heterocyclics.

Examples of the condensed polycyclic aromatic hydrocarbon include anthracene, phenanthrene, naphthacene, pyrene, chrysene, triphenylene, benzo[c]phenanthrene, benzo[a]anthracene, pentacene, perylene, dibenzo[a,j]-anthracene, dibenzo[a,h]anthracene, benzo[a]naphthacene, hexacene, and anthanthrene.

Examples of the condensed polycyclic aromatic heterocyclic include naphtho[2,1-f]isoquinoline, α-naphthaphenantolidine, phenanthroxazole, quinolino[6,5-f]quinoline, benzo[b]thiophanthrene, benzo[g]thiophanthrene, benzo[i]-thiophanthrene, and benzo[b]thiophanthraquinone.

Condensed polycyclic aromatic hydrocarbons are especially preferred, and L is preferably selected from divalent to hexavalent, especially divalent to tetravalent residues derived from such condensed polycyclic aromatic hydrocarbons.

Illustrative examples of the divalent to hexavalent residues of such condensed polycyclic aromatic hydrocarbons represented by L are given below.

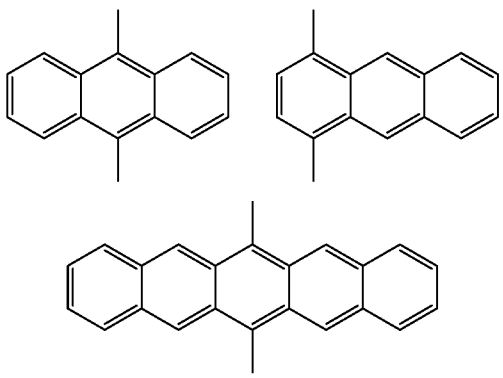

-continued
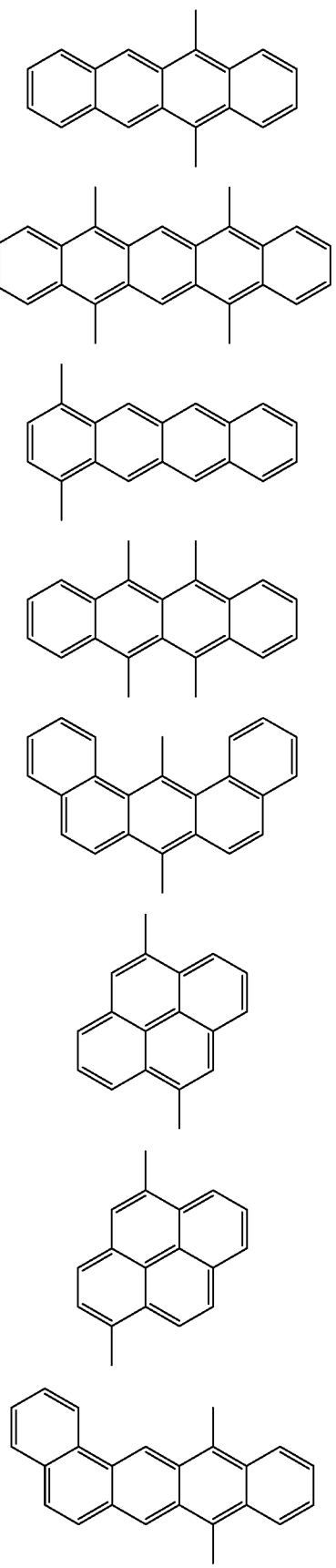
-continued
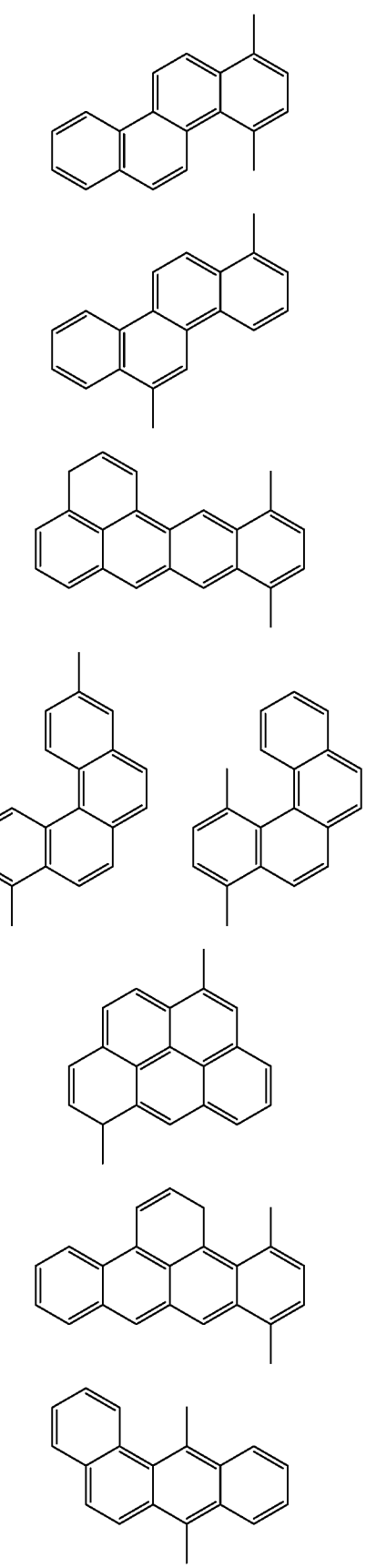

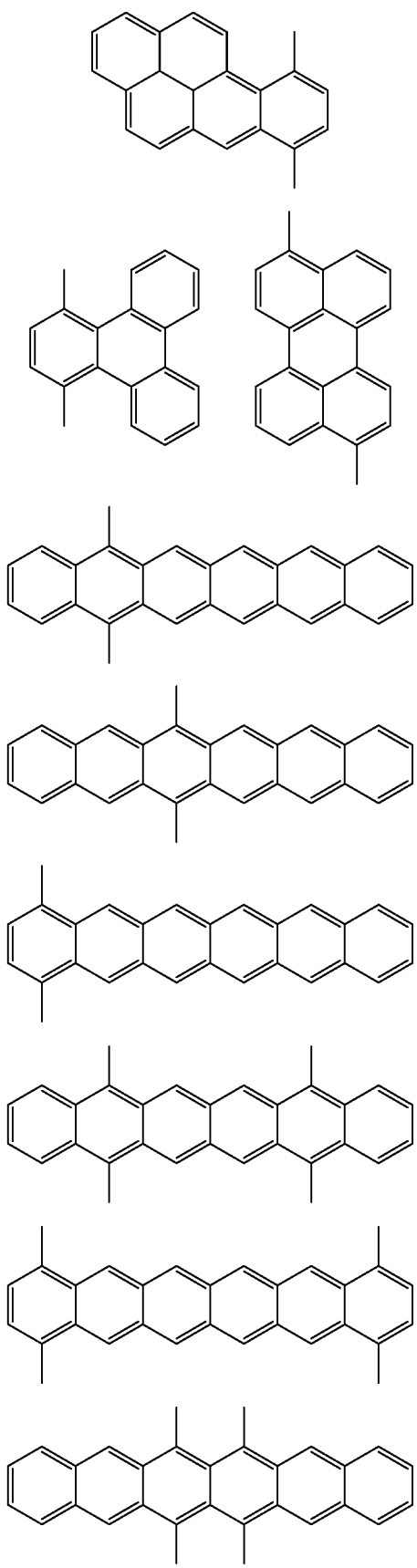
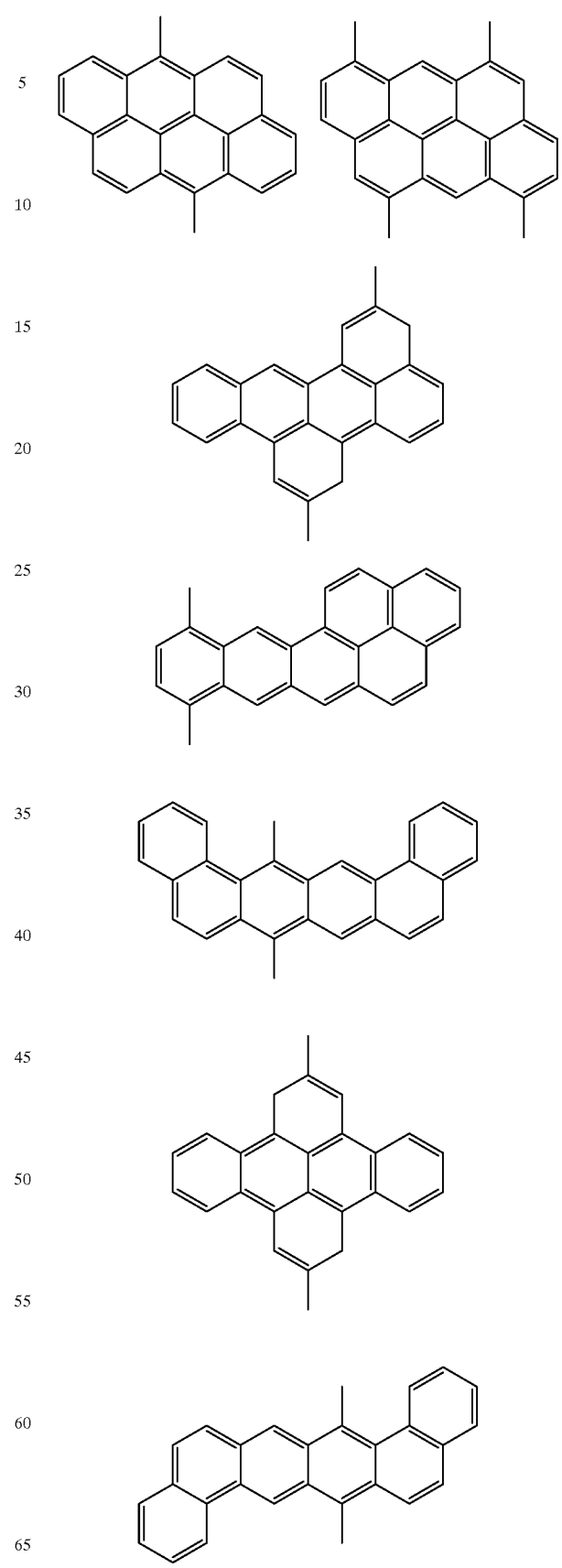

-continued
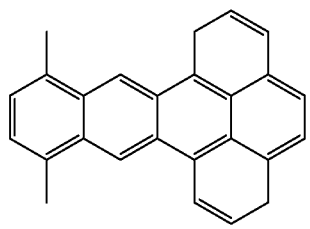
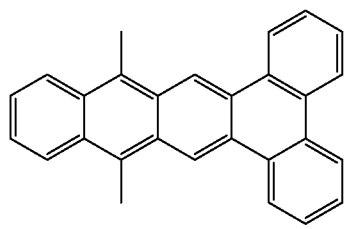
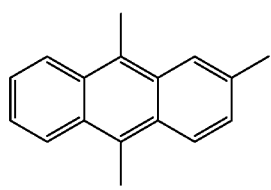
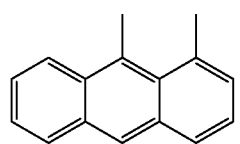
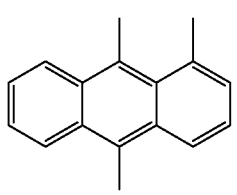
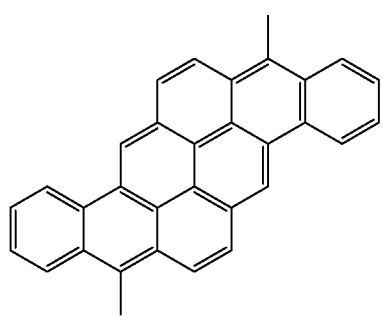
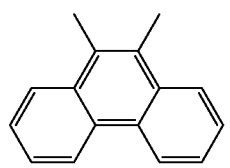
-continued
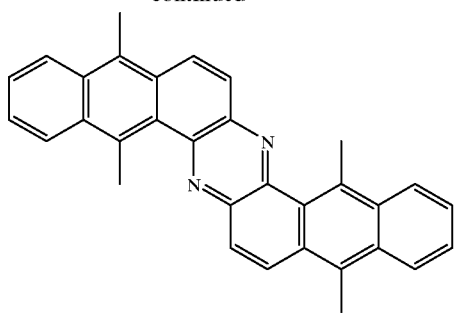
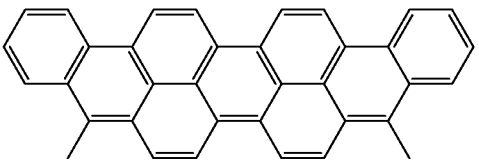
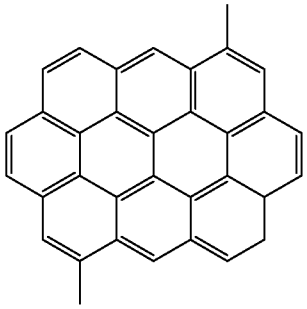
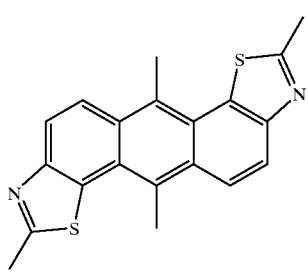
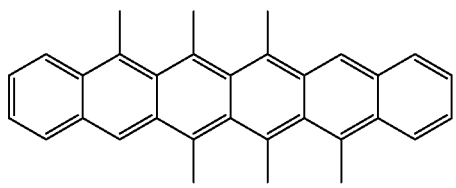
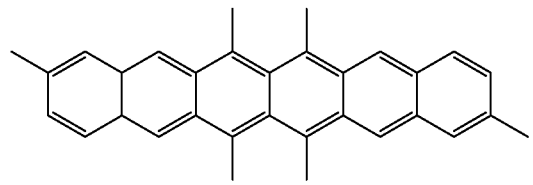
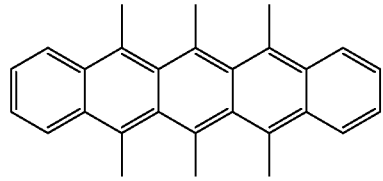

-continued

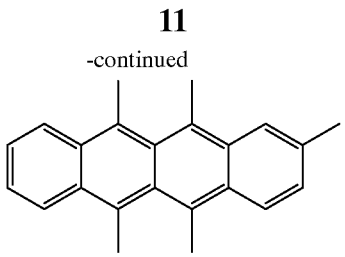

It is noted that the divalent to hexavalent residues of condensed polycyclic aromatic hydrocarbons represented by L may further have a substituent although they are preferably unsubstituted ones.

Especially L is preferably selected from divalent to hexavalent, especially divalent to tetravalent residues derived from naphthacene, pentacene or hexacene having benzene rings condensed straight. It is noted that where L is a tetravalent residue derived from naphthacene, that is, 5,6,11,12-naphthacene-tetrayl group, the four Ar groups are not phenyl groups at the same time.

Also, L is preferably selected from divalent to hexavalent, especially divalent to tetravalent residues derived from anthracene. It is noted that where L is a di- or trivalent residue derived from anthracene, at least one of two or three Ar groups is a residue derived from an alkynylarene or arylalkyne. Preferably two or more Ar groups are such residues. Especially, L is preferably a trivalent residue derived from anthracene. Preferred among the compounds of the general formula (I) are those wherein L is such a residue, two Ar groups are arylalkynyl groups, and one Ar group is a bis(arylalkynyl)anthryl group, especially those compounds of the following general formula (I-1).

$$(Ar1)_2\text{-L1-L2-}(Ar2)_2 \quad (I\text{-}1)$$

In the formula, L1 and L2 are trivalent residues derived from anthracene, which are generally the same though they may be different. Ar1 and Ar2 are arylalkynyl groups, which are generally the same though they may be different. The positions at which the arylalkynyl groups are attached to anthracene are preferably the 9 and 10-positions of anthracene while the anthracenes are coupled at 1 or 2-position. Illustrative examples of the arylalkynyl group are as described previously.

Illustrative examples of the compound of the general formula (I) are given below although the invention is not limited thereto. The examples are shown by combinations of R's in more illustrative general formulae encompassed within the general formula (I). In these general formulae, the R's shown together such as $R_1$–$R_4$ mean that they are hydrogen atoms unless otherwise stated and so, H indicates that all R's are hydrogen atoms.

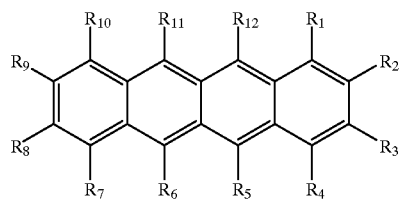

| compound No. | $R_1$~$R_4$ | R5 | R6 | $R_7$~$R_{10}$ | R11 | R12 |
|---|---|---|---|---|---|---|
| 1-1 | H | m-biphenylyl | H | H | H | m-biphenylyl |
| 1-2 | H | O-biphenylyl | H | H | H | o-biphenylyl |
| 1-3 | H | 4-n-butylphenyl | H | H | H | 4-n-butylphenyl |
| 1-4 | H | 4-t-butylphenyl | H | H | H | 4-t-butylphenyl |
| 1-5 | H | p-biphenylyl | H | H | H | p-biphenylyl |
| 1-6 | H | | H | H | H | |
| 1-7 | H | | H | H | H | |
| 1-8 | H | Ph | H | H | H | Ph |
| 1-9 | H | 2-naphthyl | H | H | H | 2-naphthyl |
| 1-10 | H | | H | H | H | |

-continued

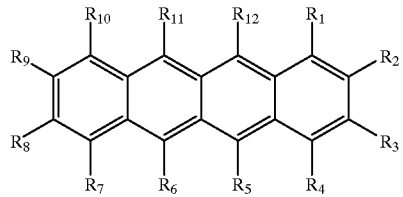

| compound No. | $R_1$~$R_4$ | R5 | R6 | $R_7$~$R_{10}$ | R11 | R12 |
|---|---|---|---|---|---|---|
| 1-11 | H | 1-naphthyl | H | H | H | 1-naphthyl |
| 1-12 | H | m-tolyl | H | H | H | m-tolyl |
| 1-13 | H | 4-(3-methylphenyl)phenyl | H | H | H | 4-(3-methylphenyl)phenyl |
| 1-14 | H | —C≡C—Ph | H | H | H | —C≡C—Ph |
| 1-15 | H | —C≡C—Ph | —C≡C—Ph | H | —C≡C—Ph | —C≡C—Ph |
| 1-16 | H | —C≡C—(3-methylphenyl) | H | H | H | —C≡C—(3-methylphenyl) |
| 1-17 | H | —C≡C—(4-(N,N-diphenylamino)phenyl) | H | H | H | —C≡C—(4-(N,N-diphenylamino)phenyl) |
| 1-18 | H | —C≡C—(2-naphthyl) | H | H | H | —C≡C—(2-naphthyl) |
| 1-19 | H | —C≡C—(3-phenylphenyl) | H | H | H | —C≡C—(3-phenylphenyl) |

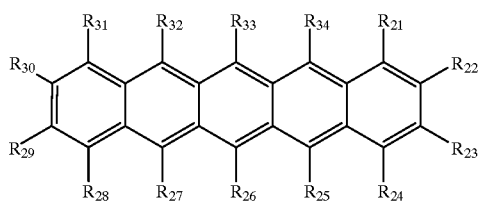

| compound No. | $R_{21}$~$R_{24}$ | $R_{25}$~$R_{27}$ | $R_{28}$~$R_{31}$ | $R_{32}$~$R_{34}$ |
|---|---|---|---|---|
| 2-1 | H | $R_{26}$ = o-biphenylyl | H | $R_{33}$ = o-biphenylyl |
| 2-2 | H | $R_{26}$ = m-biphenylyl | H | $R_{33}$ = m-biphenylyl |
| 2-3 | H | $R_{26}$ = 4-n-butylphenyl | H | $R_{33}$ = 4-n-butylphenyl |
| 2-4 | H | $R_{25}$ = m-tolyl | H | $R_{33}$ = m-tolyl |
| 2-5 | H | $R_{25}$ = $R_{27}$ = m-biphenylyl | H | $R_{32}$ = $R_{34}$ = m-biphenylyl |

-continued

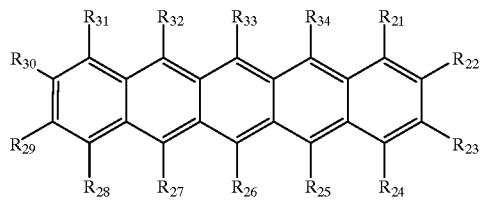

| compound No. | $R_{21}$~$R_{24}$ | $R_{25}$~$R_{27}$ | $R_{28}$~$R_{31}$ | $R_{32}$~$R_{34}$ |
|---|---|---|---|---|
| 2-6 | H | $R_{25} = R_{27}$ = 4-n-butylphenyl | H | $R_{32} = R_{34}$ = 4-n-butylphenyl |
| 2-7 | H | $R_{26}$ = p-biphenylyl | H | $R_{33}$ = p-biphenylyl |
| 2-8 | H | $R_{25} = R_{27}$ = p-biphenylyl | H | $R_{32} = R_{34}$ = p-biphenylyl |
| 2-9 | H | $R_{25} = R_{27}$ = Ph | H | $R_{32} = R_{34}$ = Ph |
| 2-10 | H | $R_{25} = R_{27}$ = m-tolyl | H | $R_{32} = R_{34}$ = m-tolyl |
| 2-11 | H | $R_{25} = R_{27}$ = (4'-methyl-biphenyl-4-yl) | H | $R_{32} = R_{34}$ = (4'-methyl-biphenyl-4-yl) |
| 2-12 | H | $R_{25} = R_{27}$ = (3'-methyl-biphenyl-3-yl) | H | $R_{32} = R_{34}$ = (3'-methyl-biphenyl-3-yl) |
| 2-13 | H | $R_{26}$ = 4-(N,N-diphenylamino)phenyl | H | $R_{33}$ = 4-(N,N-diphenylamino)phenyl |
| 2-14 | H | $R_{26}$ = 4-(N-phenyl-N-m-tolylamino)phenyl | H | $R_{33}$ = 4-(N-phenyl-N-m-tolylamino)phenyl |
| 2-15 | H | $R_{26}$ = 1-naphthyl | H | $R_{33}$ = 1-naphthyl |
| 2-16 | H | $R_{26}$ = 2-naphthyl | H | $R_{33}$ = 2-naphthyl |
| 2-17 | H | $R_{26}$ = —C≡C—Ph | H | $R_{33}$ = —C≡C—Ph |
| 2-18 | H | $R_{26}$ = —C≡C-(3-methylphenyl) | H | $R_{33}$ = —C≡C-(3-methylphenyl) |
| 2-19 | H | $R_{26}$ = —C≡C-(3-phenylphenyl) | H | $R_{33}$ = —C≡C-(3-phenylphenyl) |
| 2-20 | H | $R_{26}$ = —C≡C-(4-(N,N-diphenylamino)phenyl) | H | $R_{33}$ = —C≡C-(4-(N,N-diphenylamino)phenyl) |

-continued

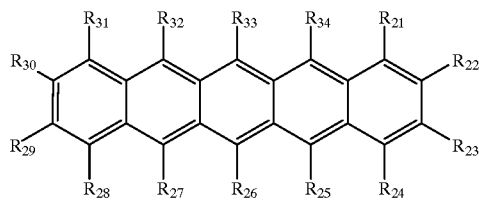

| compound No. | $R_{21}$~$R_{24}$ | $R_{25}$~$R_{27}$ | $R_{28}$~$R_{31}$ | $R_{32}$~$R_{34}$ |
|---|---|---|---|---|
| 2-21 | H | $R_{26}$ = —C≡C—(2-naphthyl) | H | $R_{33}$ = —C≡C—(2-naphthyl) |
| 2-22 | H | $R_{25} = R_{27}$ = —C≡C—Ph | H | $R_{32} = R_{34}$ = —C≡C—Ph |
| 2-23 | H | $R_{25} = R_{27}$ = —C≡C—(3-CH$_3$-phenyl) | H | $R_{32} = R_{34}$ = —C≡C—(3-CH$_3$-phenyl) |
| 2-24 | H | $R_{25} = R_{27}$ = —C≡C—(3-Ph-phenyl) | H | $R_{32} = R_{34}$ = —C≡C—(3-Ph-phenyl) |
| 2-25 | H | $R_{25} = R_{27}$ = —C≡C—C$_6$H$_4$—N(Ph)$_2$ | H | $R_{32} = R_{34}$ = —C≡C—C$_6$H$_4$—N(Ph)$_2$ |
| 2-26 | H | $R_{25} = R_{27}$ = —C≡C—C$_6$H$_4$—N(Ph)(3-CH$_3$-phenyl) | H | $R_{32} = R_{34}$ = —C≡C—C$_6$H$_4$—N(Ph)(3-CH$_3$-phenyl) |
| 2-27 | H | $R_{25} = R_{27}$ = —C≡C—(2-naphthyl) | H | $R_{32} = R_{34}$ = —C≡C—(2-naphthyl) |

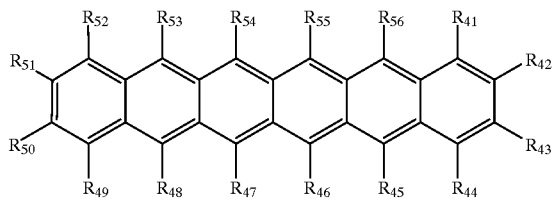

| compound No. | $R_{41}$~$R_{44}$ | $R_{45}$~$R_{48}$ | $R_{49}$~$R_{52}$ | $R_{53}$~$R_{56}$ |
|---|---|---|---|---|
| 3-1 | H | $R_{46}$ = b-biphenylyl | H | $R_{55}$ = o-biphenylyl |
| 3-2 | H | $R_{46}$ = m-biphenylyl | H | $R_{55}$ = m-biphenylyl |
| 3-3 | H | $R_{46}$ = p-biphenylyl | H | $R_{55}$ = p-biphenylyl |
| 3-4 | H | $R_{46}$ = 4-n-butylphenyl | H | $R_{55}$ = 4-n-butylphenyl |
| 3-5 | H | $R_{46}$ = m-tolyl | H | $R_{55}$ = m-tolyl |
| 3-6 | H | $R_{46}$ = 1-naphthyl | H | $R_{55}$ = 1-naphthyl |
| 3-7 | H | $R_{46}$ = 2-naphthyl | H | $R_{55}$ = 2-naphthyl |
| 3-8 | H | $R_{46}$ = -C$_6$H$_4$-N(Ph)$_2$ | H | $R_{55}$ = -C$_6$H$_4$-N(Ph)$_2$ |
| 3-9 | H | $R_{46}$ = -C$_6$H$_4$-N(Ph)(m-tolyl) | H | $R_{55}$ = -C$_6$H$_4$-N(Ph)(m-tolyl) |
| 3-10 | H | $R_{45}$ = $R_{48}$ = m-biphenylyl | H | $R_{53}$ = $R_{56}$ = m-biphenylyl |
| 3-11 | H | $R_{45}$ = $R_{48}$ = p-biphenylyl | H | $R_{53}$ = $R_{56}$ = p-biphenylyl |
| 3-12 | H | $R_{45}$ = $R_{48}$ = Ph | H | $R_{53}$ = $R_{56}$ = Ph |
| 3-13 | H | $R_{45}$ = $R_{48}$ = m-tolyl | H | $R_{53}$ = $R_{56}$ = m-tolyl |
| 3-14 | H | $R_{45}$ = $R_{48}$ = 3'-methylbiphenyl-4-yl | H | $R_{53}$ = $R_{56}$ = 3'-methylbiphenyl-4-yl |
| 3-15 | H | $R_{45}$ = $R_{48}$ = 3'-methylbiphenyl-3-yl | H | $R_{53}$ = $R_{56}$ = 3'-methylbiphenyl-3-yl |
| 3-16 | H | $R_{46}$ = 3'-methylbiphenyl-4-yl | H | $R_{55}$ = 3'-methylbiphenyl-4-yl |
| 3-17 | H | $R_{46}$ = 3'-methylbiphenyl-3-yl | H | $R_{55}$ = 3'-methylbiphenyl-3-yl |
| 3-18 | H | $R_{46}$ = —C≡C—Ph | H | $R_{55}$ = —C≡C—Ph |
| 3-19 | H | $R_{45}$ $R_{48}$ = —C≡C—Ph | H | $R_{53}$ = $R_{56}$ = —C≡C—Ph |
| 3-20 | H | $R_{45}$ = $R_{47}$ = —C≡C—Ph | H | $R_{53}$ = $R_{55}$ = —C≡C—Ph |

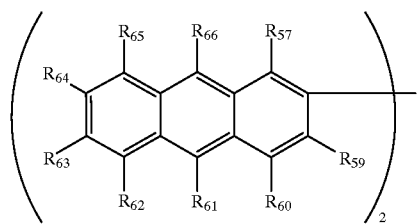
| compound No. | $R_{57}$ | $R_{59} \sim R_{66}$ |
|---|---|---|
| 4-1 | H | $R_{61} = R_{66} = -C\equiv C-Ph$ |
| 4-2 | H | $R_{61} = R_{66} = -C\equiv C-$(3-methylphenyl) |
| 4-3 | H | $R_{61} = R_{66} = -C\equiv C-$(3'-methylbiphenyl-4-yl) |
| 4-4 | H | $R_{61} = R_{66} = -C\equiv C-$(3-phenylphenyl) |
| 4-5 | H | $R_{61} = R_{66} = -C\equiv C-$(2-phenylphenyl) |
| 4-6 | H | $R_{61} = R_{66} = -C\equiv C-$(4-phenylphenyl) |
| 4-7 | H | $R_{61} = R_{66} = -C\equiv C-$(3'-methylbiphenyl-3-yl) |
| 4-8 | H | $R_{61} = R_{66} = -C\equiv C-$C6H4-N(Ph)2 |
| 4-9 | H | $R_{61} = R_{66} = -C\equiv C-$C6H4-N(Ph)(3-methylphenyl) |

-continued
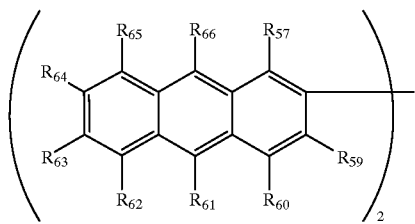
| compound No. | $R_{57}$ | $R_{59} \sim R_{66}$ |
|---|---|---|
| 4-10 | H | $R_{61} = R_{66} = $ —C≡C—C$_6$H$_4$—n-C$_4$H$_9$ |
| 4-11 | H | $R_{61} = R_{66} = $ —C≡C—(1-naphthyl) |
| 4-12 | H | $R_{61} = R_{66} = $ —C≡C—(2-naphthyl) |
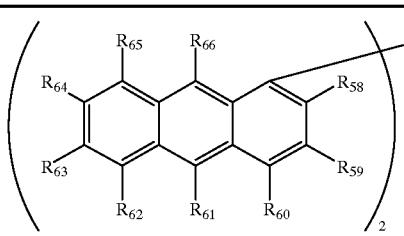
| compound No. | $R_{58} \sim R_{66}$ |
|---|---|
| 5-1 | $R_{61} = R_{66} = $ —C≡C—Ph |
| 5-2 | $R_{61} = R_{66} = $ —C≡C—(3-CH$_3$-C$_6$H$_4$) |
| 5-3 | $R_{61} = R_{66} = $ —C≡C—(4-(3-CH$_3$-C$_6$H$_4$)-C$_6$H$_4$) |
| 5-4 | $R_{61} = R_{66} = $ —C≡C—(3-Ph-C$_6$H$_4$) |
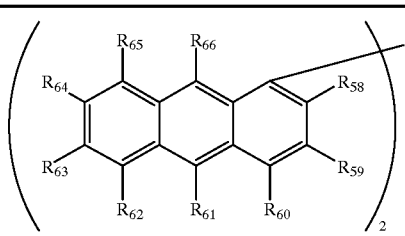
| compound No. | $R_{58} \sim R_{66}$ |
|---|---|
| 5-5 | $R_{61} = R_{66} = $ —C≡C—(2-Ph-C$_6$H$_4$) |
| 5-6 | $R_{61} = R_{66} = $ —C≡C—(4-Ph-C$_6$H$_4$) |
| 5-7 | $R_{61} = R_{66} = $ —C≡C—(3-(3-CH$_3$-C$_6$H$_4$)-C$_6$H$_4$) |

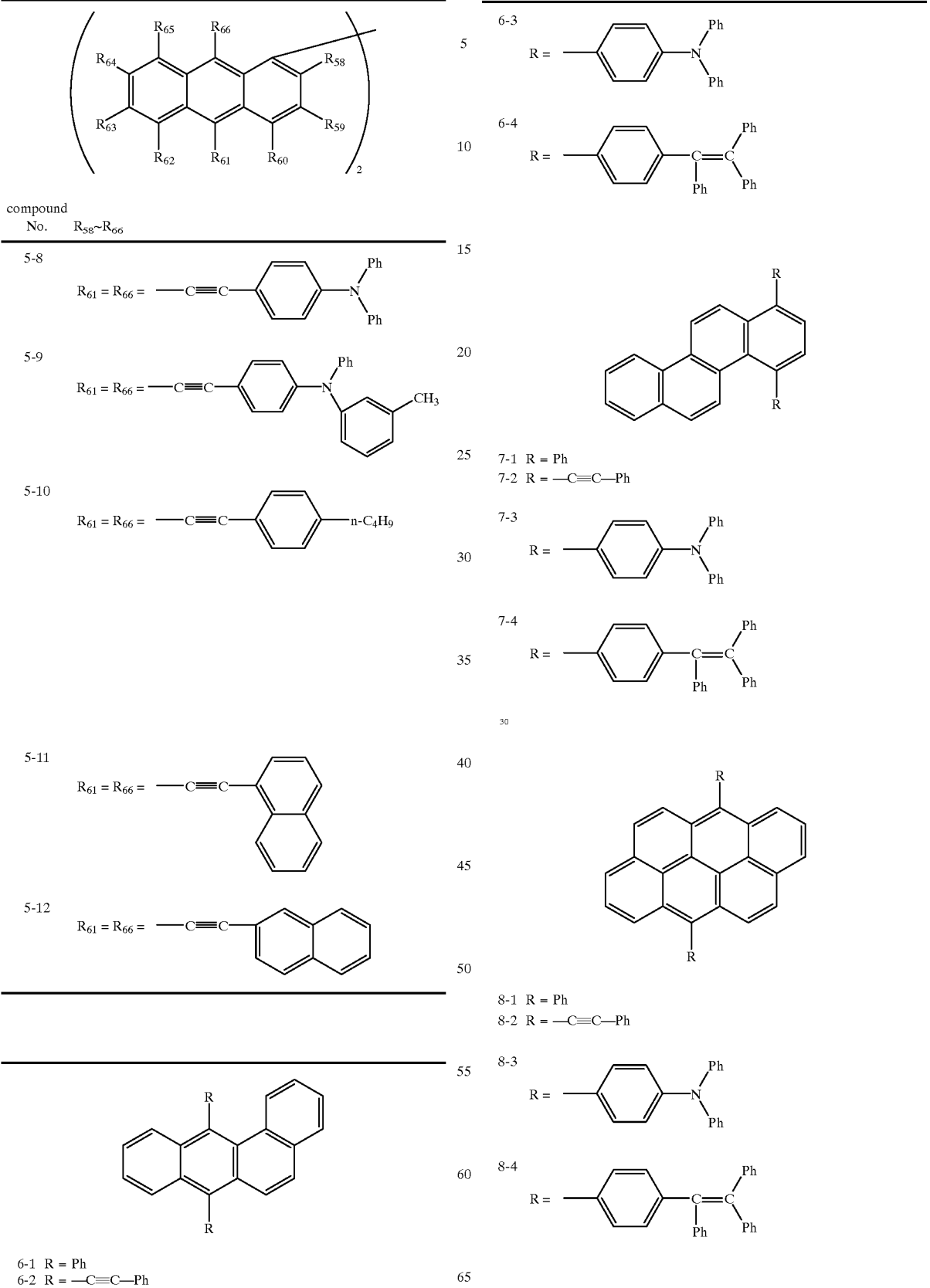

-continued

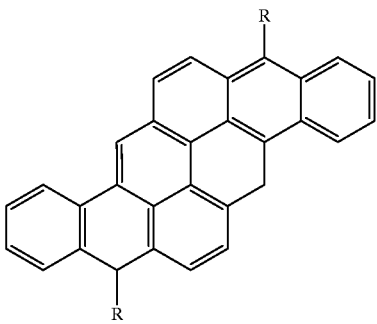

9-1 R = Ph
9-2 R = —C≡C—Ph 9-3 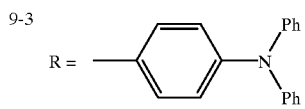

9-4 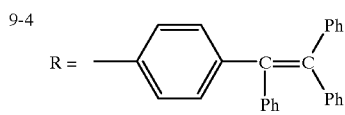

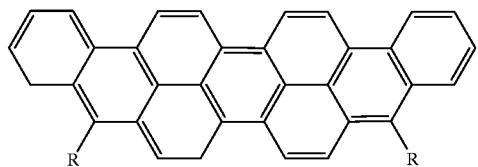

10-1 R = Ph
10-2 R = —C≡C—Ph 10-3 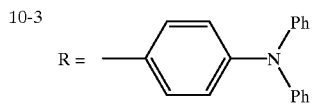

10-4 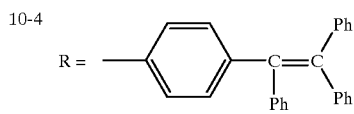

The compounds of the general formula (I) can be synthesized by a process of reacting an aromatic compound having a quinone structure with a Grignard reagent or lithiation reagent followed by reduction (see Maulding, D. R., et al., J. Org. Chem., 34, 1734 (1969) and Hanhela, P. J., et al., Aust. J. Chem., 34, 1687 (1981)) or a similar process. The compounds of the general formula (I-1) can be synthesized by a process of coupling halogenated bis(arylalkynyl) anthracenes in the presence of $Ni(cod)_2$ wherein cod is 1,5-cyclooctadiene.

Synthetic examples are shown below.

SYNTHESIS EXAMPLE 1

Synthesis of 5,12-bis(m-biphenylyl)-naphthacene
(Compound No. 1-1)

Into a nitrogen-purged 200-ml Schlenk flask were admitted 2.58 g (10 mmol) of 5,12-naphthacenequinone and 100 ml of toluene. To the solution, a toluene/ether solution of 3.5 g (21.8 mmol) of m-biphenyllithium which had been separately synthesized from m-bromobiphenyl and butyllithium was added dropwise over one hour. After the dropwise addition, the solution was stirred for 12 hours at room temperature and poured into ice water. The reaction solution was extracted 5 times with toluene, washed with water, dried over magnesium sulfate, distilled of the solvent, and washed with methanol and hexane, yielding 3.5 g of a diol.

Into a 300-ml flask, 3.5 g of the diol and 100 ml of acetic acid were admitted for dissolution. A solution of 1.0 g of tin (II) chloride in 10 ml of hydrochloric acid was 30 added dropwise to the solution, which was stirred for one hour at 100° C. and then cooled to room temperature. The reaction solution was extracted with 400 ml of toluene, washed 5 times with water, and then dried over magnesium sulfate. After the solvent was distilled off, the product was purified three times through a silica gel column using toluene and hexane as an extracting solvent under light shielded condition and recrystallized from toluene, obtaining 3.0 g of orange crystals. Upon purification of 1 g of the crystals by sublimation, there was obtained 0.6 g of orange crystals.

SYNTHESIS EXAMPLE 2

Synthesis of 5,12-bis(o-biphenylyl)-naphthacene
(Compound No. 1-2)

Into a nitrogen-purged 200-ml Schlenk flask were admitted 2.58 g (10 mmol) of 5,12-naphthacenequinone and 100 ml of toluene. To the solution, a toluene/ether solution of 3.5 g (21.8 mmol) of o-biphenyllithium which had been separately synthesized from o-iodobiphenyl and butyllithium was added dropwise over one hour. After the dropwise addition, the solution was stirred for 12 hours at room temperature and poured into ice water. The reaction solution was extracted 5 times with toluene, washed with water, dried over magnesium sulfate, distilled of the solvent, and washed with methanol and hexane, yielding 3.5 g of a diol.

Into a 300-ml flask, 3.5 g of the diol and 100 ml of acetic acid were admitted for dissolution. A solution of 1.0 g of tin (II) chloride in 10 ml of hydrochloric acid was added dropwise to the solution, which was stirred for one hour at 100° C. and then cooled to room temperature. The reaction solution was extracted with 600 ml of toluene, washed 5 times with water, and then dried over magnesium sulfate. After the solvent was distilled off, the product was purified three times through a silica gel column using toluene and hexane as an extracting solvent under light shielded condition and recrystallized from toluene, obtaining 2.5 g of orange crystals. Upon purification of 1 g of the crystals by sublimation, there was obtained 0.6 g of orange crystals.

SYNTHESIS EXAMPLE 3

Synthesis of 5,12-bis(4-n-butylphenyl)-naphthacene
(Compound No. 1-3)

Into a nitrogen-purged 200-ml Schlenk flask were admitted 2.58 g (10 mmol) of 5,12-naphthacenequinone and 100 ml of toluene. To the solution, a toluene/ether solution of 3.0 g (21.2 mmol) of 4-n-butylphenyllithium which had been separately synthesized from 4-n-butyliodobenzene and butyllithium was added dropwise over one hour. After the dropwise addition, the solution was stirred for 12 hours at room temperature and poured into ice water. The reaction solution was extracted 5 times with toluene, washed with water, dried over magnesium sulfate, distilled of the solvent, and washed with methanol and hexane, yielding 3.0 g of a diol.

Into a 300-ml flask, 3.0 g of the diol and 100 ml of acetic acid were admitted for dissolution. A solution of 1.0 g of tin (II) chloride in 10 ml of hydrochloric acid was added dropwise to the solution, which was stirred for one hour at 100° C. and then cooled to room temperature. The reaction solution was extracted with 400 ml of toluene, washed 5 times with water, and then dried over magnesium sulfate. After the solvent was distilled off, the product was purified three times through a silica gel column using toluene and hexane as an extracting solvent and re-crystallized from toluene, obtaining 3.0 g of orange crystals. Upon purification of 1 g of the crystals by sublimation, there was obtained 0.8 g of orange crystals.

Figure 2:
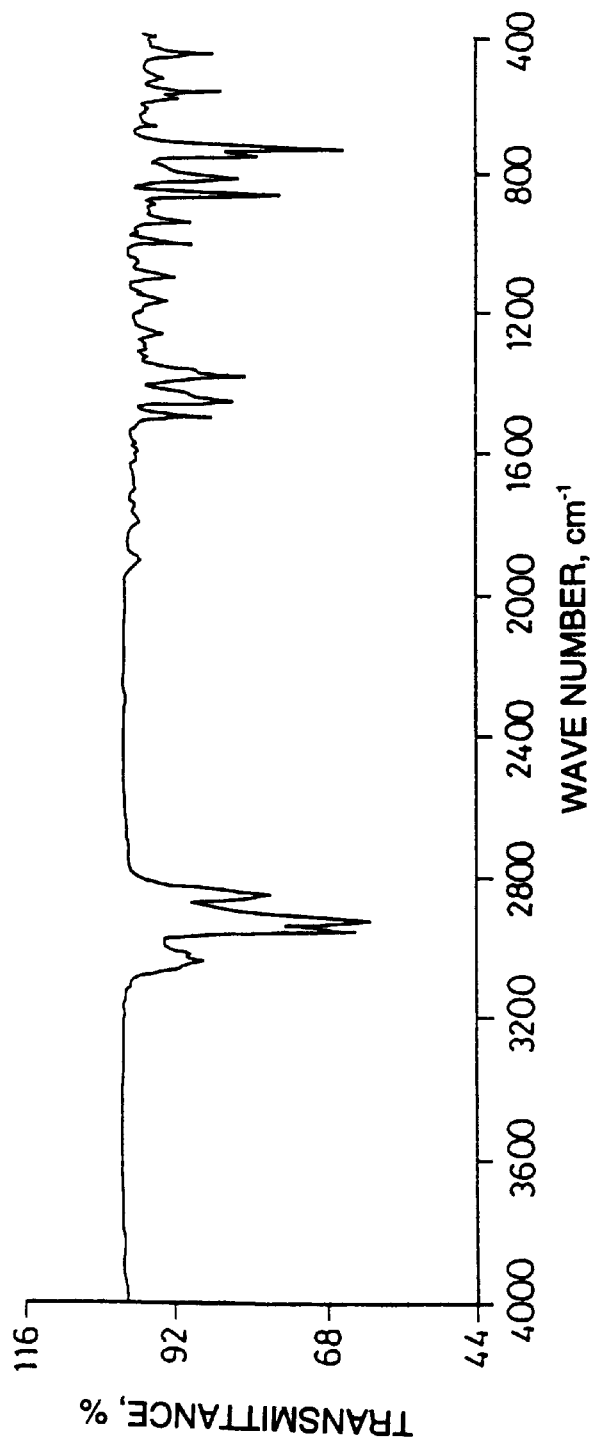
FIG. 2 is a graph showing the IR spectrum of a compound synthesized in the invention.
Figure 3:
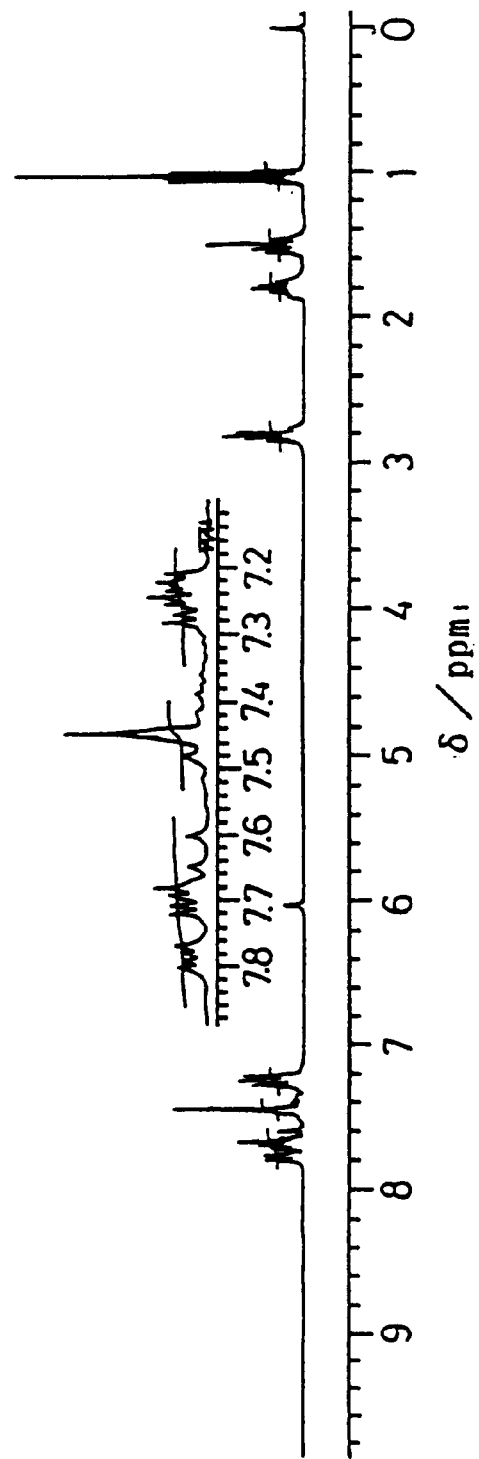
FIG. 3 is a graph showing the NMR spectrum of the compound synthesized in the invention.

Mass analysis: m/e 492 (M+); Infrared absorption spectrum: FIG. 2; NMR spectrum: FIG. 3.

SYNTHESIS EXAMPLE 4

Synthesis of 6,13-bis(o-biphenylyl)-pentacene (Compound No. 2-1)

Into a nitrogen-purged 200-ml Schlenk flask were admitted 3.08 g (10 mmol) of 6,13-pentacenequinone and 100 ml of toluene. To the solution, a toluene/ether solution of 3.5 g (21.8 mmol) of o-biphenyllithium which had been separately synthesized from o-bromobiphenyl and butyllithium was added dropwise over one hour. After the dropwise addition, the solution was stirred for 12 hours at room temperature and poured into ice water. After the reaction solution was filtered, the residue was washed with water and toluene, yielding 4.0 g of a diol.

Into a 300-ml flask, 4.0 g of the diol and 100 ml of acetic acid were admitted for dissolution. A solution of 1.0 g of tin (II) chloride in 10 ml of hydrochloric acid was added dropwise to the solution, which was stirred for one hour at 100° C. and then cooled to room temperature. The reaction solution was extracted with 400 ml of toluene, washed 5 times with water, and then dried over magnesium sulfate. After the solvent was distilled off, the product was purified three times through a silica gel column using toluene and hexane as an extracting solvent and recrystallized from toluene, obtaining 2.0 g of blue purple crystals. Upon purification of 0.8 g of the crystals by sublimation, there was obtained 0.3 g and 0.1 g of brown purple crystals.

Figure 4:
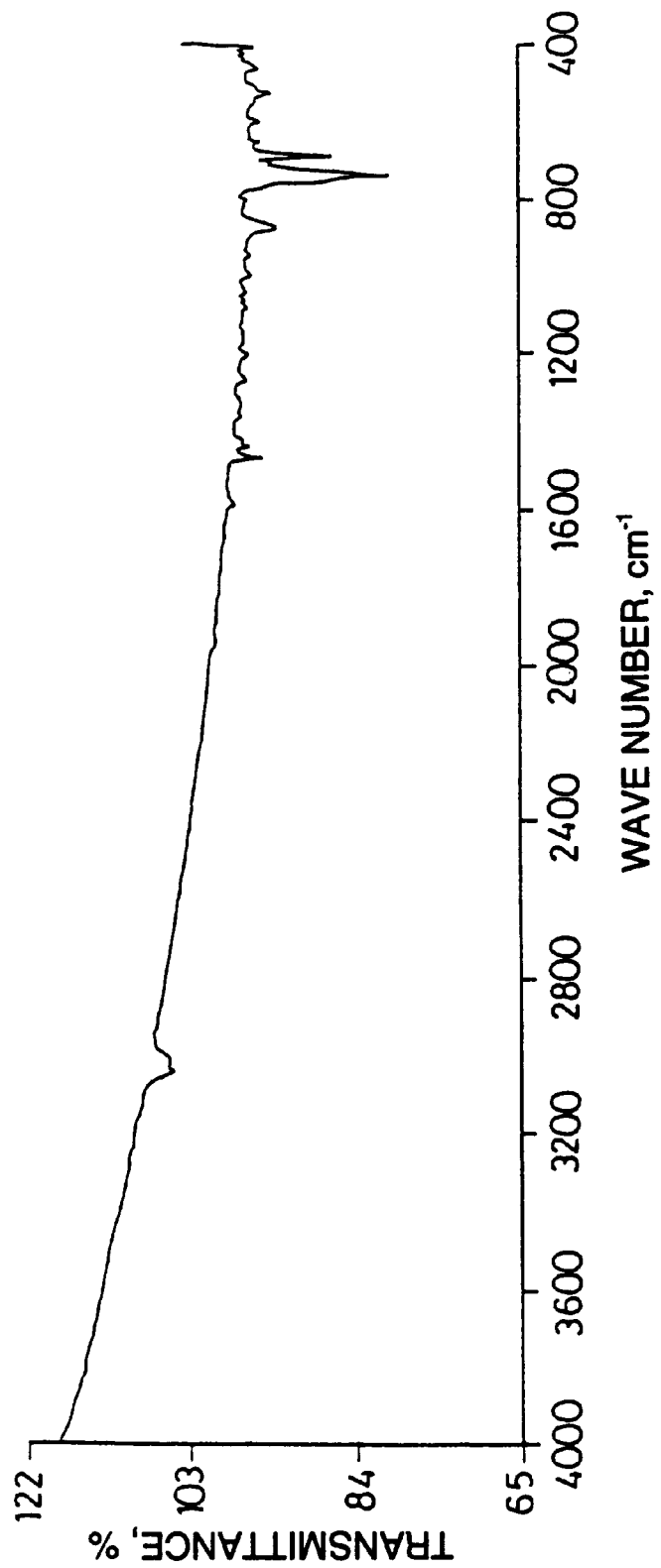
FIG. 4 is a graph showing the IR spectrum of another compound synthesized in the invention.
Figure 5:
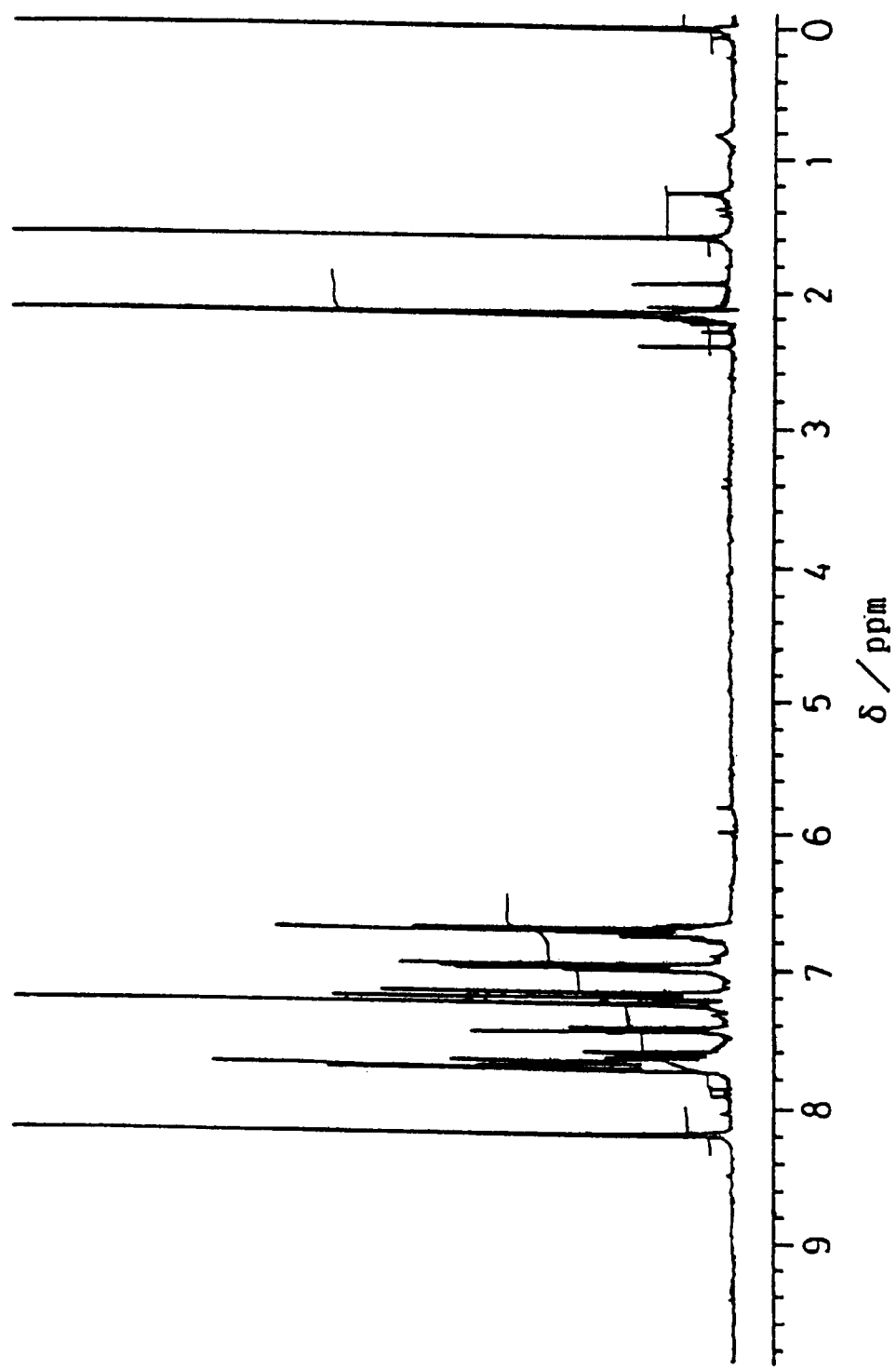
FIG. 5 is a graph showing the NMR spectrum of the compound synthesized in the invention.

Mass analysis: m/e 583 (M+); Infrared absorption spectrum: FIG. 4; NMR spectrum: FIG. 5.

SYNTHESIS EXAMPLE 5

Synthesis of 6,13-bis(m-biphenylyl)-pentacene (Compound No. 2-2)

Into a nitrogen-purged 200-ml Schlenk flask were admitted 3.08 g (10 mmol) of 6,13-pentacenequinone and 100 ml of toluene. To the solution, a toluene/ether solution of 3.5 g (21.8 mmol) of m-biphenyllithium which had been separately synthesized from m-bromobiphenyl and butyllithium was added dropwise over one hour. After the dropwise addition, the solution was stirred for 12 hours at room temperature and poured into ice water. After the reaction solution was filtered, the residue was washed with water and toluene, yielding 5.0 g of a diol.

Into a 300-ml flask, 5.0 g of the diol and 100 ml of acetic acid were admitted for dissolution. A solution of 1.0 g of tin (II) chloride in 10 ml of hydrochloric acid was added dropwise to the solution, which was stirred for one hour at 100° C. and then cooled to room temperature. The reaction solution was extracted with 400 ml of toluene and 200 ml of chloroform, washed 5 times with water, and then dried over magnesium sulfate. After the solvent was distilled off, the product was purified three times through a silica gel column using toluene and hexane as an extracting solvent and recrystallized from toluene, obtaining 3.0 g of blue purple crystals. Upon purification of 1 g of the crystals by sublimation, there was obtained 0.6 g of brown purple crystals.

SYNTHESIS EXAMPLE 6

Synthesis of 6,13-bis(4-n-butylphenyl)-pentacene (Compound No. 2-3)

Into a nitrogen-purged 200-ml Schlenk flask were admitted 3.08 g (10 mmol) of 6,13-pentacenequinone and 100 ml of toluene. To the solution, a toluene/ether solution of 3.0 g (21.2 mmol) of 4-n-butylphenyllithium which had been separately synthesized from 4-n-butyliodobenzene and butyllithium was added dropwise over one hour. After the dropwise addition, the solution was stirred for 12 hours at room temperature and poured into ice water. The reaction solution was extracted with toluene, washed three times with water, dried over magnesium sulfate, and distilled of the solvent. The solids were washed with methanol and purified through a silica gel column, yielding 4.0 g of a diol.

Into a 300-ml flask, 4.0 g of the diol and 100 ml of acetic acid were admitted for dissolution. A solution of 1.0 g of tin (II) chloride in 10 ml of hydrochloric acid was added dropwise to the solution, which was stirred for one hour at 100° C. and then cooled to room temperature. The reaction solution was extracted with 400 ml of toluene, washed 5 times with water and then with a 10% sodium hydrogencarbonate aqueous solution, and then dried over magnesium sulfate. After the solvent was distilled off, the product was purified three times through a silica gel column using toluene and hexane as an extracting solvent, obtaining 3.0 g of blue purple crystals. Upon purification of 1 g of the crystals by sublimation, there was obtained 0.7 g of brown purple crystals.

SYNTHESIS EXAMPLE 7

Synthesis of 5,7,12,14-tetrakis(m-biphenylyl) pentacene (Compound No. 2-5)

Into a nitrogen-purged 200-ml Schlenk flask were admitted 3.38 g (10 mmol) of 5,7,12,14-pentacenetetrone and 100 ml of toluene. To the solution, a toluene/ether solution of 7.0 g (43.7 mmol) of m-biphenyllithium which had been separately synthesized from m-bromobiphenyl and butyllithium was added dropwise over one hour. After the dropwise addition, the solution was stirred for 12 hours at room temperature and poured into ice water. After the reaction solution was filtered, the solids were washed with water and toluene, yielding 5.5 g of a diol.

Into a 300-ml flask, 5.5 g of the diol and 100 ml of acetic acid were admitted for dissolution. A solution of 1.0 g of tin (II) chloride in 10 ml of hydrochloric acid was added dropwise to the solution, which was stirred for one hour at 100° C. and then cooled to room temperature. The reaction solution was combined with 200 ml of toluene and washed 5 times with water. The reaction solution was filtered, washed with water and toluene, and recrystallized from chloroform, obtaining 3.0 g of blue purple crystals. Upon purification of 1 g of the crystals by sublimation, there was obtained 0.6 g of brown purple crystals.

SYNTHESIS EXAMPLE 8

Synthesis of 5,7,12,14-tetrakis(4-butylphenyl) pentacene (Compound No. 2-6)

Into a nitrogen-purged 200-ml Schlenk flask were admitted 3.38 g (10 mmol) of 5,7,12,14-pentacenetetrone and 100 ml of toluene. To the solution, a toluene/ether solution of 6.0 g (42.5 mmol) of 4-n-butylphenyllithium which had been separately synthesized from 4-n-butylbenzene and butyllithium was added dropwise over one hour. After the dropwise addition, the solution was stirred for 12 hours at room temperature, poured into ice water, and extracted with toluene. The reaction solution was washed with water, dried over magnesium sulfate, and distilled of the solvent, yielding 6.5 g of a diol.

Into a 300-ml flask, 6.5 g of the diol and 100 ml of acetic acid were admitted for dissolution. A solution of 1.0 g of tin (II) chloride in 10 ml of hydrochloric acid was added dropwise to the solution, which was stirred for one hour at 100° C. and then cooled to room temperature. The reaction solution was combined with 800 ml of toluene, washed 5 times with water, dried over magnesium sulfate, and distilled of the solvent, obtaining blue purple crystals. The blue purple crystals were purified 3 times through a silica gel column using hexane and toluene as an extracting solvent, and recrystallized from toluene/hexane, obtaining 3.0 g of blue purple crystals. Upon purification of 1 g of the crystals by sublimation, there was obtained 0.6 g of blue purple crystals.

SYNTHESIS EXAMPLE 9

Synthesis of Compound No. 4-1

In a nitrogen atmosphere, 0.37 g (1.35 mmol) of bis(1,5-cyclooctadiene)nickel $Ni(cod)_2$, 0.20 g (1.28 mmol) of 2,2'-bipyridine, and 0.20 ml of 1,5-cyclooctadiene were mixed with 20 ml of N,N-dimethylformamide. Additionally, 1.23 g (2.74 mmol) of 2-chloro-9,10-bis(phenylethynyl)-anthracene was added to the mixture, which was stirred at 60° C. for 24 hours. The reaction solution was poured into a 1N hydrochloric acid aqueous solution, extracted with toluene and chloroform, washed with water, and dried over magnesium sulfate. The resulting product was reprecipitated in acetone, recrystallized 3 times from chloroform, and purified through a silica column using toluene as an extracting solvent, obtaining 0.8 g of an orange solid. Upon purification of 0.8 g of the orange solid by sublimation, there was obtained 0.52 g of an orange solid.

SYNTHESIS EXAMPLE 10

Synthesis of Compound No. 5-1

In a nitrogen atmosphere, 0.37 g (1.35 mmol) of bis(1,5-cyclooctadiene)nickel $Ni(cod)_2$, 0.20 g (1.28 mmol) of 2,2'-bipyridine, and 0.20 ml of 1,5-cyclooctadiene were mixed with 20 ml of N,N-dimethylformamide. Additionally, 1.23 g (3.00 mmol) of 1-chloro-9,10-bis(phenylethynyl)-anthracene was added to the mixture, which was stirred at 60° C. for 24 hours. The reaction solution was poured into a 1N hydrochloric acid aqueous solution, extracted with toluene and chloroform, washed with water, and dried over magnesium sulfate. The resulting product was reprecipitated in acetone, recrystallized 3 times from chloroform, and purified through a silica column using toluene as an extracting solvent, obtaining 0.53 g of an orange solid. Upon purification of 0.5 g of the orange solid by sublimation, there was obtained 0.23 g of an orange solid with yellow fluorescence.

Mass analysis: m/e 754 ($M^+$);

The compounds of the general formula (I) can be identified by elemental analysis, mass analysis, infrared (IR) absorption spectroscopy, and proton nuclear magnetic resonance (NMR) spectroscopy, with data of some compounds being shown above.

These compounds have a molecular weight of about 400 to about 1,500, a melting point of about 100° C. to about 400° C., and a glass transition temperature of about 80° C. to about 250° C. Consequently, as by vacuum evaporation, they form transparent, smooth, satisfactory films which are in a stable amorphous state above room temperature and keep the state over a long period of time. They can form thin films by themselves without using binder resins.

The compounds of the general formula (I) may be used alone or in admixture of two or more.

One exemplary structure of the organic EL element having at least one organic compound layer containing the compound of the general formula (I) according to the present invention is shown in FIG. 1. The organic EL element 1 shown in FIG. 1 includes on a substrate 2, an anode 3, a hole injecting and transporting layer 4, a light emitting layer 5, an electron injecting and transporting layer 6, and a cathode 7 stacked in the described order.

The light emitting layer has multi-functions of injecting holes and electrons, transporting them, and recombining holes and electrons to create excitons. It is preferred that relatively electronically neutral compounds be used in the light emitting layer. The hole injecting and transporting layer has functions of facilitating injection of holes from the anode, transporting them, and obstructing electron transportation. The electron injecting and transporting layer has functions of facilitating injection of electrons from the cathode, transporting them, and obstructing hole transportation. These layers are effective for increasing the number of holes and electrons injected into the light emitting layer and confining holes and electrons therein for optimizing the recombination region to improve light emission efficiency. Therefore the hole and electron injecting and transporting layers are optionally provided by taking into account the magnitude of the respective functions of the compound used in the light emitting layer for electron injection and transportation and hole injection and transportation. For example, if the compound used in the light emitting layer has an enhanced hole or electron injecting and transporting function, the hole or electron injecting and transporting layer may be omitted because the light emitting layer itself can also serve as a hole or electron injecting and transporting layer. In some cases, both the hole and electron injecting and transporting layers may be omitted. Each of the hole and electron injecting and transporting layers may consist of two sublayers, one sublayer having an injecting function and another sublayer having a transporting function.

The thickness of the light emitting layer, hole injecting and transporting layer, and electron injecting and transporting layer is not critical and varies with a particular formation technique although it is usually preferred to be about 5 to 1,000 nm, especially about 10 to 200 nm.

The thicknesses of the hole injecting and transporting layer and electron injecting and transporting layer are equal to or range from 1/10 to 10 times the thickness of the light emitting layer although they depend on the design of a recombination/light emitting region. When the electron or hole injecting and transporting layer is divided into an injecting layer and a transporting layer, preferably the injecting layer is at least 1 nm thick and the transporting layer is at least 20 nm thick. The upper limit of thickness is about 100 nm for the injecting layer and about 1,000 nm for the transporting layer. The same film thickness applies when two injecting and transporting layers are provided.

A freedom of design of the recombination/light emitting region is available by controlling the film thickness in consideration of the carrier mobility and carrier density (which is dependent on ionization potential and electron affinity) of the light emitting layer, electron injecting and transporting layer, and hole injecting and transporting layer to be combined. This enables free design of luminous color, control of the luminance and spectrum of light emission by the interference of the electrodes, and control of the space distribution of light emission.

It is preferred that the compound of the general formula (I) be used in a light emitting layer, and the organic compound layer containing the compound of the general formula (I) be a light emitting layer.

In the practice of the invention, the light emitting layer may additionally contain another luminescent material in addition to the compound of the general formula (I). The luminescent material may be selected from compounds as disclosed in JP-A 264692/1988, for example, quinacridone, rubrene, and styryl dyes alone or in admixture. Also included are quinoline derivatives, for example, metal complex dyes having 8-quinolinol or a derivative thereof as a ligand such as tris(8-quinolinolato)aluminum, tetraphenylbutadiene, anthracene, perylene, coronene, and 12-phthaloperinone derivatives. Further included are phenylanthracene derivatives of Japanese Patent Application No. 110569/1994 and tetraarylethene derivatives of Japanese Patent Application No. 114456/1994.

In the light emitting layer, the compound of the general formula (I) is preferably contained in an amount of at least 0.01% by weight, especially at least 0.1% by weight.

In particular, it is preferred to use the compound of the general formula (I) in combination with a host material, especially a host material capable of light emission by itself, that is, to use the compound as a dopant. In this embodiment, the content of the compound of the general formula (I) in the light emitting layer is preferably 0.01 to 20% by weight, especially 0.1 to 15% by weight. By using the compound in combination with the host material, the light emission wavelength of the host material can be altered, enabling light emission shifted to a longer wavelength and improving the luminous efficacy and stability of the device.

Preferred host materials are quinoline derivatives, more preferably aluminum complexes having 8-quinolinol or a derivative thereof as a ligand. Examples of the aluminum complex are disclosed in JP-A 264692/1988, 255190/1991, 70733/1993, 258859/1993, and 215874/1994.

Examples of the former include tris(8-quinolinolato)-aluminum, bis(8-quinolinolato)magnesium, bis(benzo[f]-8-quinolinolato)zinc, bis(2-methyl-8-quinolinolato)aluminum oxide, tris(8-quinolinolato)indium, tris(5-methyl-8-quinolinolato)aluminum, 8-quinolinolatolithium, tris(5-chloro-8-quinolinolato)gallium, bis(5-chloro-8-quinolinolato)calcium, 5,7-dichloro-8-quinolinolatoaluminum, tris(5,7-dibromo-8-hydroxyquinolinolato)aluminum, and poly[zinc(II)-bis(8-hydroxy-5-quinolinyl)methane].

Also useful are aluminum complexes having another ligand in addition to 8-quinolinol or a derivative thereof. Examples include bis(2-methyl-8-quinolinolato) (phenolato)-aluminum(III), bis(2-methyl-8-quinolinolato) (ortho-cresolato)aluminum(III), bis(2-methyl-8-quinolinolato) (meta-cresolato)aluminum(III), bis(2--methyl-8-quinolinolato) (para-cresolato)aluminum(III), bis (2--methyl-8-quinolinolato)(ortho-phenylphenolato) aluminum(III), bis(2-methyl-8-quinolinolato)(meta-phenylphenolato)aluminum(III), bis(2-methyl-8-quinolinolato)(para-phenylphenolato)aluminum(III), bis(2-methyl-8-quinolinolato)(2,3-dimethylphenolato)-aluminum (III), bis(2-methyl-8-quinolinolato)(2,6-dimethyl-phenolato)aluminum(III), bis(2-methyl-8-quinolinolato)(3,4-dimethylphenolato)aluminum(III), bis(2-methyl-8-quinolinolato)(3,5-dimethylphenolato)aluminum(III), bis(2-methyl-8-quinolinolato)(3,5-di-tert-butylphenolato)-aluminum(III), bis(2-methyl-8-quinolinolato)(2,6-diphenyl-phenolato)aluminum(III), bis(2-methyl-8-quinolinolato)-(2,4,6-triphenylphenolato)aluminum(III), bis(2-methyl-8-quinolinolato)(2,3,6-trimethylphenolato)aluminum(III), bis (2-methyl-8-quinolinolato)(2,3,5,6-tetramethylphenolato)-aluminum(III), bis(2-methyl-8-quinolinolato)(1-naphtholato)-aluminum(III), bis(2-methyl-8-quinolinolato) (2-naphtholato)-aluminum(III), bis(2,4-dimethyl-8-quinolinolato)(ortho-phenylphenolato)aluminum(III), bis(2,4-dimethyl-8-quinolinolato)(para-phenylphenolato) aluminum(III), bis(2,4-dimethyl-8-quinolinolato)(meta-phenylphenolato)-aluminum(III), bis(2,4-dimethyl-8-quinolinolato)(3,5-dimethylphenolato)aluminum(III), bis(2,4-dimethyl-8-quinolinolato)(3,5-di-tert-butylphenolato) aluminum(III), bis(2-methyl-4-ethyl-8-quinolinolato) (para-cresolato)-aluminum(III), bis(2-methyl-4-methoxy-8-quinolinolato) (para-phenylphenolato)aluminum(III), bis(2-methyl-5-cyano-8-quinolinolato)(ortho-cresolato)aluminum (III), and bis(2-methyl-6-trifluoromethyl-8-quinolinolato) (2-naphtholato)-aluminum(III).

Also acceptable are bis(2-methyl-8-quinolinolato)-aluminum(III)-μ-oxo-bis(2-methyl-8-quinolinolato) aluminum (III), bis(2,4-dimethyl-8-quinolinolato)aluminum (III)-μ-oxo-bis(2,4-dimethyl-8-quinolinolato)aluminum (III), bis(4-ethyl-2-methyl-8-quinolinolato)aluminum(III)-μ-oxo-bis(4-ethyl-2-methyl-8-quinolinolato)aluminum (III), bis(2-methyl-4-methoxyquinolinolato)aluminum(III)-μ-oxo-bis(2-methyl-4-methoxyquinolinolato)aluminum (III), bis(5-cyano-2-methyl-8-quinolinolato)aluminum(III)-μ-oxo-bis(5-cyano-2-methyl-8-quinolinolato)aluminum (III), and bis(2-methyl-5-trifluoromethyl-8-quinolinolato) aluminum(III)-μ-oxo-bis(2-methyl-5-trifluoromethyl-8-quinolinolato)aluminum (III).

In the practice of the invention, it is especially preferred to use tris(8-quinolinolato)aluminum among others.

Other useful host materials are phenylanthracene derivatives as described in Japanese Patent Application No. 110569/1994 and tetraarylethene derivatives as described in Japanese Patent Application No. 114456/1994.

The phenylanthracene derivatives are represented by the general formula (II).

$A^1\text{-}L^1\text{-}A^2$ (II)

In the general formula (II), $A^1$ and $A^2$ each are a monophenylanthryl or diphenylanthryl group and they may be identical or different.

The monophenylanthryl or diphenylanthryl group represented by $A^1$ and $A^2$ may be a substituted or unsubstituted one. The substituents, if any, include alkyl, aryl, alkoxy, aryloxy, and amino groups, which may be further substituted. Although the position of such substituents on the phenylanthryl group is not critical, the substituents are preferably positioned on the phenyl group attached to the anthracene ring rather than on the anthracene ring. Preferably the phenyl group is bonded to the anthracene ring at its 9- or 10-position.

In the general formula (II), $L^1$ is a valence bond or an arylene group. The arylene group represented by $L^1$ is preferably an unsubstituted one. Examples include ordinary arylene groups such as phenylene, biphenylene, and anthrylene while two or more directly concatenated arylene groups are also included. Preferably $L^1$ is a valence bond, p-phenylene group or 4,4'-biphenylene group.

The arylene group represented by $L^1$ may be a group having two or more arylene groups separated by an alkylene group, —O—, —S— or —NR—. R is an alkyl or aryl group. Exemplary alkyl groups are methyl and ethyl and an exemplary aryl group is phenyl. Preferably R is an aryl group which is typically phenyl as just mentioned while it may be $A^1$ or $A^2$ or phenyl having $A^1$ or $A^2$ substituted thereon. Preferred alkylene groups are methylene and ethylene groups.

The tetraarylethene derivatives are represented by the following formula.

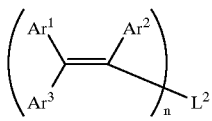

In the formula, $Ar^1$, $Ar^2$, and $Ar^3$ each are an aromatic residue and they may be identical or different.

The aromatic residues represented by $Ar^1$ to $Ar^3$ include aromatic hydrocarbon groups (aryl groups) and aromatic heterocyclic groups. The aromatic hydrocarbon groups may be monocyclic or polycyclic aromatic hydrocarbon groups inclusive of fused rings and ring gathering. The aromatic hydrocarbon groups preferably have 6 to 30 carbon atoms in total and may have a substituent. The substituents, if any, include alkyl groups, aryl groups, alkoxy groups, aryloxy groups, and amino groups. Examples of the aromatic hydrocarbon group include phenyl, alkylphenyl, alkoxyphenyl, arylphenyl, aryloxyphenyl, aminophenyl, biphenyl, naphthyl, anthryl, pyrenyl, and perylenyl groups.

Preferred aromatic heterocyclic groups are those containing O, N or S as a hetero-atom and may be either five or six-membered. Examples are thienyl, furyl, pyrrolyl, and pyridyl groups.

Phenyl groups are especially preferred among the aromatic groups represented by $Ar^1$ to $Ar^3$.

Letter n is an integer of 2 to 6, preferably an integer of 2 to 4.

$L^2$ represents an n-valent aromatic residue, preferably divalent to hexavalent, especially divalent to tetravalent residues derived from aromatic hydrocarbons, aromatic heterocyclics, aromatic ethers or aromatic amines. These aromatic residues may further have a substituent although unsubstituted ones are preferred.

Preferably, the light emitting layer using the compound of the general formula (I) is not only a layer in which the compound is combined with a host material as mentioned above, but also a layer of a mixture of at least one hole injecting and transporting compound and at least one electron injecting and transporting compound in which the compound of the general formula (I) is contained as a dopant. In such a mix layer, the content of the compound of the general formula (I) is preferably 0.01 to 20% by weight, especially 0.1 to 15% by weight.

In the mix layer, carrier hopping conduction paths are created, allowing carriers to move through a polarly predominant material while injection of carriers of opposite polarity is rather inhibited. The organic compound is less susceptible to damage, resulting in the advantage of an extended device life. By incorporating the compound of the general formula (I) in such a mix layer, the light emission wavelength the mix layer itself possesses can be altered, enabling light emission shifted to a longer wavelength and improving the luminous intensity and stability of the device.

The hole injecting and transporting compound and electron injecting and transporting compound used in the mix layer may be selected from hole injecting and transporting compounds and electron injecting and transporting compounds to be described later, respectively. It is preferred to use quinoline derivatives and metal complexes having 8-quinolinol or a derivative thereof as a ligand, especially tris(8-quinolinolato)aluminum as the electron injecting and transporting compound.

With respect to the mix ratio, which depends on carrier mobility, it is preferred that the weight ratio of the hole injecting and transporting compound to the electron injecting and transporting compound range from about 30/70 to 70/30, more preferably from about 40/60 to 60/40, especially about 50/50.

The thickness of the mix layer preferably ranges from the thickness corresponding to a single molecule layer to less than the thickness of an organic compound layer, for example, preferably from 1 to 85 nm, more preferably 5 to 60 nm, most preferably 5 to 50 nm.

Preferably the mix layer is formed by a co-deposition process of evaporating the compounds from distinct sources. If both the compounds have equal or very close vapor pressure or evaporation temperature, they may be pre-mixed in a common evaporation boat, from which they are evaporated together. The mix layer is preferably a uniform mixture of both the compounds although the compounds can be present in island form. The light emitting layer is generally formed to a predetermined thickness by evaporating an organic fluorescent material or coating a dispersion thereof in a resin binder.

In the practice of the invention, an electron injecting and transporting layer may be provided. For the electron injecting and transporting layer, there may be used quinoline derivatives including organic metal complexes having 8-quinolinol or a derivative thereof as a ligand such as tris(8-quinolinolato)aluminum, oxadiazole derivatives, perylene derivatives, pyridine derivatives, pyrimidine derivatives, quinoxaline derivatives, diphenylquinone derivatives, and nitro-substituted fluorene derivatives. In another embodiment wherein the electron injecting and transporting layer also serves as a light emitting layer, use of tris(8-quinolinolato)aluminum is preferred. Like the light emitting layer, the electron injecting and transporting layer may be formed by evaporation or the like.

Where the electron injecting and transporting layer is formed as comprising an electron injecting layer and an electron transporting layer, two or more compounds are selected in a proper combination from the compounds commonly used in electron injecting and transporting layers. In this regard, it is preferred to laminate layers such that a layer of a compound having a greater electron affinity may be disposed adjacent the cathode, that is, to dispose the electron injecting layer adjacent the cathode and the electron transporting layer adjacent the light emitting layer. The relationship of electron affinity to the order of lamination also applies where a plurality of electron injecting and transporting layers are provided.

In the practice of the invention, a hole injecting and transporting layer may be provided. For the hole injecting and transporting layer, there may be used various organic compounds as described in JP-A 295695/1988, 191694/1990, and 000792/1991, for example, aromatic tertiary amines, hydrazone derivatives, carbazole derivatives, triazole derivatives, imidazole derivatives, oxadiazole derivatives having an amino group, and polythiophenes. These compounds may be used in admixture of two or more or as stacked layers.

Where the hole injecting and transporting layer is formed as comprising a hole injecting layer and a hole transporting layer, two or more compounds are selected in a proper combination from the compounds commonly used in hole injecting and transporting layers. In this regard, it is preferred to laminate layers such that a layer of a compound having a lower ionization potential may be disposed adjacent the anode (ITO etc.), that is, to dispose the hole injecting layer adjacent the anode and the hole transporting layer adjacent the light emitting layer. It is also preferred to use a compound having good thin film forming ability at the anode surface. The relationship of ionization potential to the order of lamination also applies where a plurality of hole injecting and transporting layers are provided. Such an order of lamination is effective for lowering drive voltage and preventing current leakage and development and growth of dark spots. Since evaporation is utilized in manufacturing devices, films as thin as about 1 to 10 nm can be formed uniform and pinhole-free, which restrains any change in color tone of light emission and a drop of efficiency by re-absorption even if a compound having a low ionization potential and absorption in the visible range is used in the hole injecting layer.

Where two or more hole injecting and transporting layers are stacked, or where a hole injecting layer and a hole transporting layer are stacked, it is preferred to use a polythiophene with good thin film formability in the hole injecting layer or first hole injecting and transporting layer on the anode and an aromatic tertiary amine such as N,N'-bis(m-tolyl)-N,N'-diphenyl-1,1'-biphenyl-4,4'-diamine in the hole transporting layer or second hole injecting and transporting layer.

The polythiophenes used herein are preferably those described in EP 643118A1 (Japanese Patent Application No. 170312/1994). The polythiophenes preferably contain at least one of thiophene-2,5-diyl and thiophene-2,4-diyl as a structural unit of the polymer, may be either homopolymers consisting of identical recurring units or copolymers consisting of different recurring units, and have a weight average molecular weight Mw of about 300 to 10,000 and a degree of polymerization of about 4 to 100. Preferred examples include poly(thiophene-2,5-diyl), poly(thiophene-2,4-diyl), and (thiophene-2,5-diyl)/(thiophene-2,4-diyl) copolymers, with the poly(thiophene-2,5-diyl) being most preferred. The polythiophenes may be used alone or in admixture of two or more. Most of the polythiophenes used herein have a melting point of at least 300° C. and some have no melting point while amorphous or microcrystalline films of quality can be formed by vacuum evaporation.

In addition to the above-mentioned example, preferred examples of the aromatic tertiary amine are those described in Japanese Patent Application No. 43564/1995. More particularly, included are N,N,N',N'-tetra(3-biphenylyl)-benzidine, N,N'-diphenyl-N,N'-bis[4'-(N-phenyl-N-3-methyl-phenylamino)biphenyl-4-yl]benzidine, N,N'-diphenyl-N,N'-bis[4'-(N,N-di-3-biphenylylamino)biphenyl-4-yl]benzidine, N,N'-diphenyl-N,N'-bis[4'-(N-phenyl-N-2-naphthylamino)-biphenyl-4-yl]benzidine, N,N'-diphenyl-N,N'-bis[4'-(N-phenyl-N-3-biphenylylamino)biphenyl-4-yl]benzidine, and N,N'-diphenyl-N,N'-bis[4'-(N,N'-di-3-methylphenylamino)-biphenyl-4-yl]benzidine.

In the practice of the invention, the organic compound layer may further contain a singlet oxygen quencher. Exemplary quenchers include rubrene, nickel complexes, diphenylisobenzofuran, and tertiary amines.

In the practice of the invention, the cathode is preferably made of a material having a low work function, for example, Li, Na, Mg, Al, Ag, In and alloys containing at least one of these metals. The cathode should preferably be of fine grains, especially amorphous. The cathode is preferably about 10 to 1,000 nm thick.

In order that the organic EL element produce plane light emission, at least one of the electrodes should be transparent or translucent. Since the material of the cathode is limited as mentioned just above, it is preferred to select the material and thickness of the anode so as to provide a transmittance of at least 80% to the emitted radiation. For example, the anode is preferably made of ITO, $SnO_2$, Ni, Au, Pt, Pd, and doped polypyrrole. The anode preferably has a thickness of about 10 to 500 nm. In order that the device be more reliable, the drive voltage should be low. To this end, ITO having 10 to 30 $\Omega/cm^2$ or less than 10 $\Omega/cm^2$ (commonly about 0.1 to 10 $\Omega/cm^2$) is preferred.

The substrate material is not critical although a transparent or translucent material such as glass and resins is used in the illustrated embodiment wherein light exits from the substrate side. The substrate may be provided with a color filter layer, fluorescent material-containing color conversion film or dielectric reflecting film for controlling emission light color.

It is noted that where the substrate is made of an opaque material, the layer stacking order may be reversed from that shown in FIG. 1.

Next, it is described how to prepare the organic EL element of the present invention.

The cathode and anode are preferably formed by gas phase deposition techniques such as evaporation and sputtering.

The light emitting layer and hole and electron injecting and transporting layers are preferably formed by vacuum evaporation because homogeneous thin films are available. By utilizing vacuum evaporation, there is obtained a homogeneous thin film which is amorphous or has a grain size of less than 0.1 $\mu$m (usually the lower limit is about 0.001 $\mu$m). If the grain size is more than 0.1 $\mu$m, uneven light emission would take place and the drive voltage of the device must be increased with a substantial lowering of electric charge injection efficiency.

The conditions for vacuum evaporation are not critical although a vacuum of $10^{-3}$ Pa or lower and an evaporation rate of about 0.1 to 1 nm/sec. are preferred. It is preferred to successively form layers in vacuum because the successive formation in vacuum can avoid adsorption of impurities at the interface between the layers, thus ensuring better performance. The drive voltage of a device can also be reduced.

In the embodiment wherein the respective layers are formed by vacuum evaporation, where it is desired for a single layer to contain two or more compounds, boats having the compounds received therein are individually temperature controlled to achieve co-deposition although the compounds may be previously mixed before evaporation. Besides, solution coating techniques (such as spin coating, dipping, and casting) and Langmuir-Blodgett (LB) technique may also be utilized. In the solution coating techniques, the compounds may be dispersed in matrix materials such as polymers.

The organic EL element of the invention is generally of the DC drive type while it can be of the AC or pulse drive type. The applied voltage is generally about 2 to 20 volts.

EXAMPLE

Examples of the present invention are given below by way of illustration.

Example 1

A glass substrate having an ITO transparent electrode (anode) of 200 nm thick was subjected to ultrasonic cleaning with neutral detergent, acetone, and ethanol. The substrate was pulled up from boiling ethanol, dried, and then cleaned with $UV/O_3$. The substrate was secured by a holder in a vacuum evaporation chamber, which was evacuated to a vacuum of $1 \times 10^{-4}$ Pa or lower.

First of all, poly(thiophene-2,5-diyl) was evaporated at a deposition rate of 0.1 nm/sec. to a thickness of about 10 nm to form a hole injecting layer. Then N,N'-bis(m-tolyl)-N,N'-diphenyl-1,1'-biphenyl-4,4-diamine (to be designated TPD hereinafter) was evaporated at a deposition rate of 0.1 to 0.2 nm/sec. to a thickness of about 65 nm to form a hole transporting layer.

With the vacuum kept, tris(8-quinolinolato)aluminum (to be designated Alq3 hereinafter) and 6,13-bis(o-biphenylyl)-pentacene (Compound No. 2-1) were co-evaporated at a deposition rate of 0.1 to 0.2 nm/sec. and 0.0005 to 0.001 nm/sec. (0.542 wt %), respectively, to a total thickness of about 20 nm to form a light emitting layer.

Next, Alq3 was evaporated at a deposition rate of 0.1 to 0.2 nm/sec. to a thickness of about 30 nm to form an electron injecting and transporting layer.

With the vacuum kept further, Mg and Ag were co-evaporated at a deposition rate of 0.1 to 0.2 nm/sec. and 0.02 to 0.04 nm/sec. (weight ratio 10:1), respectively, to a total thickness of about 200 rm to form a cathode, obtaining an EL element.

Upon application of a DC voltage of 8 V across the EL element, current flowed at about 90 $mA/cm^2$ to produce light emission at a luminance of 1,100 $cd/m^2$ and an efficiency of 0.5 lm/W. The light emission was yellow and had peak wavelengths of 630 nm, 680 nm, and 515 nm and CIE chromaticity coordinates x=0.45 and y=0.46. Additionally, the device was continuously driven at a constant current density of 10 $mA/cm^2$ in a dry atmosphere. The initial luminance was 110 $cd/m^2$ at 6.2 V. The half-life of luminance was about 500 hours, with a drive voltage increase of 2.9 V.

It is noted that where the light emitting layer was formed solely of Alq3, the light emission was green and had a peak wavelength of 510 nm.

Example 2

An EL element was prepared as in Example 1 except that Alq3 and Compound No. 2-1 were co-evaporated at a deposition rate of 0.1 to 0.2 nm/sec. and 0.003 to 0.007 nm/sec. (3.40 wt %), respectively, to a total thickness of about 21 nm to form a light emitting layer.

Upon application of a DC voltage of 10 V across the EL element, current flowed at about 215 $mA/cm^2$ to produce light emission at a luminance of 530 $cd/m^2$ and an efficiency of 0.08 lm/W. The light emission was orange and had peak wavelengths of 630 nm and 685 nm and CIE chromaticity coordinates x=0.57 and y=0.38. Additionally, the device was continuously driven at a constant current density of 10 $mA/cm^2$ in a dry atmosphere. The initial luminance was 22 $cd/m^2$ at 6.8 V. The half-life of luminance was about 200 hours, with a drive voltage increase of 1.5 V.

Example 3

An EL element was prepared as in Example 1 except that Alq3 and Compound No. 2-1 were co-evaporated at a deposition rate of 0.1 to 0.2 nm/sec. and 0.003 to 0.007 nm/sec. (3.11 wt %), respectively, to a total thickness of about 44 nm to form a light emitting layer and thereafter Alq3 was evaporated at a deposition rate of 0.1 to 0.2 nm/sec. to a thickness of about 7 nm to form an electron injecting and transporting layer.

Upon application of a DC voltage of 11 V across the EL element, current flowed at about 62 $mA/cm^2$ to produce light emission at a luminance of 150 $cd/m^2$ and an efficiency of 0.7 lm/W. The light emission was red and had peak wavelengths of 630 nm and 685 nm and CIE chromaticity coordinates x=0.68 and y=0.31. Additionally, the device was continuously driven at a constant current density of 10 $mA/cm^2$ in a dry atmosphere. The initial luminance was 24 $cd/m^2$ at 6.2 V. The half-life of luminance was about 150 hours, with a drive voltage increase of 1.6 V.

Example 4

An EL element was prepared as in Example 3 except that Compound No. 2-1 was replaced by 6,13-bis(m-tolyl) pentacene (Compound No. 2-4). This resulted in red light emission having characteristics as in Example 3.

Example 5

A glass substrate having an ITO transparent electrode (anode) of 200 nm thick was subjected to ultrasonic cleaning with neutral detergent, acetone, and ethanol. The substrate was pulled up from boiling ethanol, dried, and then cleaned with $UV/O_3$. The substrate was secured by a holder in a vacuum evaporation chamber, which was evacuated to a vacuum of $1 \times 10^{-4}$ Pa or lower.

First of all, poly(thiophene-2,5-diyl) was evaporated at a deposition rate of 0.1 nm/sec. to a thickness of about 10 nm to form a hole injecting layer. Then TPD was evaporated at a deposition rate of 0.1 to 0.2 nm/sec. to a thickness of about 45 nm to form a hole transporting layer.

With the vacuum kept, TPD as the hole injecting and transporting compound and Alq3 as the electron injecting and transporting compound were then evaporated at a substantially identical deposition rate of 0.1 to 0.2 nm/sec. and at the same time, Compound No. 2-1 was evaporated at a deposition rate of 0.006 to 0.014 nm/sec. (3.25 wt %) to form a mix layer of about 40 nm thick as a light emitting layer.

With the vacuum kept further, Alq3 was evaporated at a deposition rate of 0.1 to 0.2 nm/sec. to a thickness of about 30 nm to form an electron injecting and transporting layer.

With the vacuum kept further, Mg and Ag were co-evaporated at a deposition rate of 0.1 to 0.2 nm/sec. and 0.02 to 0.04 nm/sec. (weight ratio 10:1), respectively, to a total thickness of about 200 nm to form a cathode, obtaining an EL element.

Upon application of a DC voltage of 10 V across the EL element, current flowed at about 100 $mA/cm^2$ to produce light emission at a luminance of 360 $cd/m^2$ and an efficiency of 1.1 lm/W. The light emission was red and had peak wavelengths of 630 nm and 685 nm and CIE chromaticity coordinates x=0.69 and y=0.30. Additionally, the device was continuously driven at a constant current density of 10 $MA/cm^2$ in a dry atmosphere. The initial luminance was 37 $cd/m^2$ at 6.9 V. The half-life of luminance was about 1,200 hours, with a drive voltage increase of 4.6 V.

Example 6

An EL element was prepared as in Example 3 except that Compound No. 2-1 was replaced by Compound No. 4-1. This EL element produced green light emission having a peak wavelength of 530 to 540 nm.

In Examples 1 to 3 and 5, various EL elements having a combination of compounds different from those of Examples 1 to 6 were prepared using one or more compounds of the general formula (I) instead of Compound No. 2-1. They were examined for characteristics to find similar results corresponding to a particular device construction.

BENEFITS OF THE INVENTION

According to the invention, there is obtained an organic EL element which emits yellow to red long wavelength light of satisfactory luminance and is fully durable in that it maintains the light emitting performance for a long time.

What is claimed is:

1. An organic electroluminescent element comprising:
   a light emitting layer which is a mixed layer comprising at least one hole-injecting and transporting compound and at least one electron-injecting and transporting compound as host materials, said layer containing 0.01 to 20 wt % of a compound of the formula (I) as a guest material:

$(Ar)_m$-L    (I)

wherein Ar is selected from the group consisting of arylalkynyl arylphenyl and aminophenyl, m is an integer of 2 to 6, the Ar groups may be the same or different, and L is a m-valent residue of a condensed polycyclic aromatic compound having 3 to 10 rings, with the proviso that where L is a di- or trivalent residue derived from anthracene, at least one Ar is an aromatic residue derived from an alkynylarene;

b) at least one hole-injecting and transporting layer;
   c) at least one electron-injecting and transporting layer; and
   d) electrodes.

2. The organic electroluminescent element of claim 1 wherein Ar is an aromatic hydrocarbon residue, and L is a di-, tri- or tetravalent residue derived from a condensed polycyclic aromatic hydrocarbon.

3. The organic electroluminescent element of claim 2 wherein said condensed polycyclic aromatic hydrocarbon is naphthacene, pentacene or hexacene.

4. The organic electroluminescent element of claim 1 wherein L is a trivalent residue derived from anthracene, two Ar groups are arylalkynyl groups, and one Ar group is a bis(arylalkynyl)anthryl group.

5. The organic electroluminescent element of claim 1 wherein said light emitting layer contains a quinoline derivative.

6. The organic electroluminescent element of claim 5 wherein said quinoline derivative is tris(8-quinolinolato)-aluminum.

7. The organic electroluminescent element of claim 1 wherein said hole injecting and transporting layer includes at least one hole injecting layer and at least one hole transporting layer, said light emitting layer adjoining the hole transporting layer.

8. The organic electroluminescent element of claim 1 wherein said electron injecting and transporting layer includes at least one electron injecting layer and at least one electron transporting layer, said light emitting layer adjoining the electron transporting layer.

* * * * *